US008262251B2

(12) United States Patent
Rains, Jr. et al.

(10) Patent No.: US 8,262,251 B2
(45) Date of Patent: *Sep. 11, 2012

(54) LIGHT FIXTURE USING DOPED SEMICONDUCTOR NANOPHOSPHOR IN A GAS

(75) Inventors: Jack C. Rains, Jr., Herndon, VA (US); David P. Ramer, Reston, VA (US)

(73) Assignee: ABL IP Holding LLC, Conyers, GA (US)

( * ) Notice: Subject to any disclaimer, the term of this patent is extended or adjusted under 35 U.S.C. 154(b) by 233 days.

This patent is subject to a terminal disclaimer.

(21) Appl. No.: 12/704,355

(22) Filed: Feb. 11, 2010

(65) Prior Publication Data

US 2010/0277059 A1  Nov. 4, 2010

Related U.S. Application Data

(63) Continuation-in-part of application No. 12/609,523, filed on Oct. 30, 2009, which is a continuation-in-part of application No. 12/434,248, filed on May 1, 2009, now Pat. No. 8,028,537, application No. 12/704,355, which is a continuation-in-part of application No. 12/697,596, filed on Feb. 1, 2010, and a continuation-in-part of application No. 12/629,614, filed on Dec. 2, 2009, now Pat. No. 7,845,825.

(51) Int. Cl.
 *F21V 9/16* (2006.01)
(52) U.S. Cl. ........................ 362/235; 362/231
(58) Field of Classification Search .................. 362/230, 362/231, 235, 245
 See application file for complete search history.

(56) References Cited

U.S. PATENT DOCUMENTS

| 4,675,575 A | 6/1987 | Smith et al. |
| 5,136,483 A | 8/1992 | Schoniger et al. |
| 6,533,429 B2 | 3/2003 | Yoneda |
| 6,969,843 B1 | 11/2005 | Beach et al. |
| 6,992,317 B2 | 1/2006 | Jain et al. |
| 7,122,961 B1 | 10/2006 | Wedding |

(Continued)

OTHER PUBLICATIONS

International Search Report and the Written Opinion of the International Searching Authority issued in International Patent Application No. PCT/US2010/028302 dated May 19, 2010.

(Continued)

*Primary Examiner* — David V Bruce
(74) *Attorney, Agent, or Firm* — McDermott Will & Emery LLP

(57) ABSTRACT

A light fixture, for example a white light fixture for a general lighting application, uses a solid state source and one or more semiconductor nanophosphors dispersed in a gas contained in the fixture. Exemplary sources use one or more LEDs rated for emission of a wavelength in the range of 460 nm and below. Nanophosphors used in the specific examples are doped semiconductor nanophosphors. The gas and semiconductor nanophosphor(s) are remotely deployed, for example, at a remote location in or around a macro optical element (optic) such as a window, a reflector, a diffuser, an optical integrating cavity, etc. of the light fixture. The gas with the doped semiconductor nanophosphor(s) dispersed therein may appear at least substantially clear when the solid state source is off.

30 Claims, 11 Drawing Sheets

U.S. PATENT DOCUMENTS

| | | | |
|---|---|---|---|
| 7,148,632 B2 | 12/2006 | Berman et al. | |
| 7,237,927 B2 | 7/2007 | Coushaine | |
| 7,768,192 B2 | 8/2010 | Van De Ven et al. | |
| 7,806,556 B2 | 10/2010 | Wu | |
| 7,891,840 B1 | 2/2011 | Kang et al. | |
| 2004/0135504 A1 | 7/2004 | Tamaki et al. | |
| 2005/0230673 A1 | 10/2005 | Mueller et al. | |
| 2007/0230164 A1 | 10/2007 | Vivenzio et al. | |
| 2007/0230167 A1 | 10/2007 | McMahon et al. | |
| 2008/0291670 A1 | 11/2008 | Rains | |
| 2010/0172122 A1* | 7/2010 | Ramer et al. | 362/84 |
| 2011/0127555 A1* | 6/2011 | Rains et al. | 257/98 |

OTHER PUBLICATIONS

International Preliminary Report on Patentability (Chapter I of the Patent Cooperation Treaty) issued in International Patent Application No. PCT/US2010/028295 dated Nov. 10, 2011.

International Preliminary Report on Patentability (Chapter I of the Patent Cooperation Treaty) issued in International Patent Application No. PCT/US2010/028302 dated Nov. 10, 2011.

United States Notice of Allowance issued in U.S. Appl. No. 12/434,248, dated Jul. 26, 2011.

U.S. Notice of Allowance issued in U.S. Appl. No. 12/609,523, dated Jan. 11, 2012.

* cited by examiner

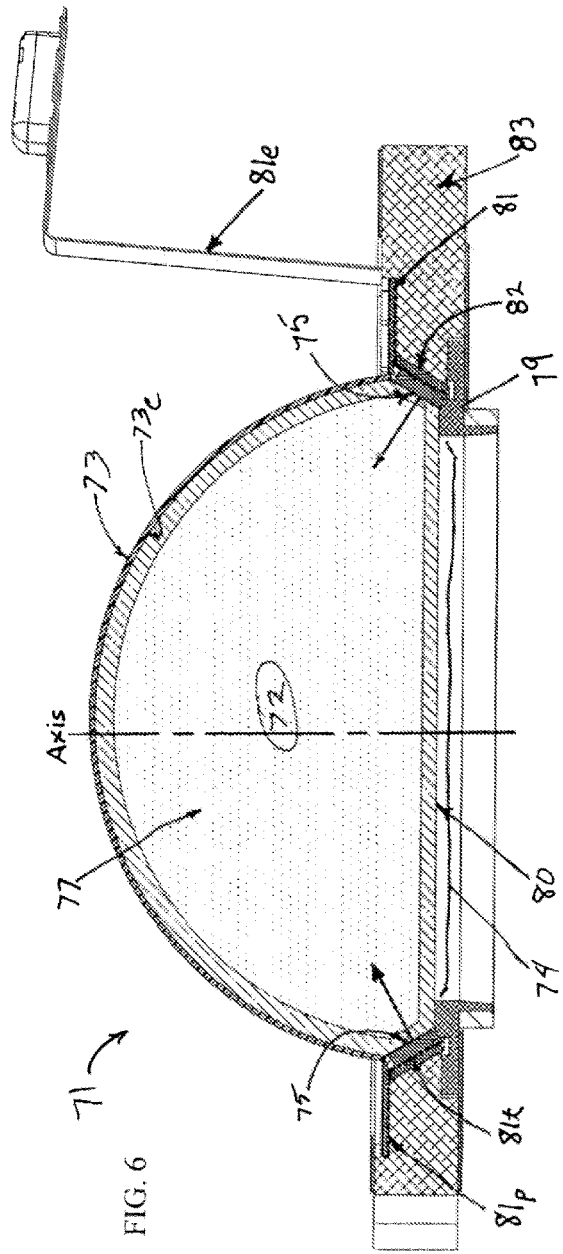
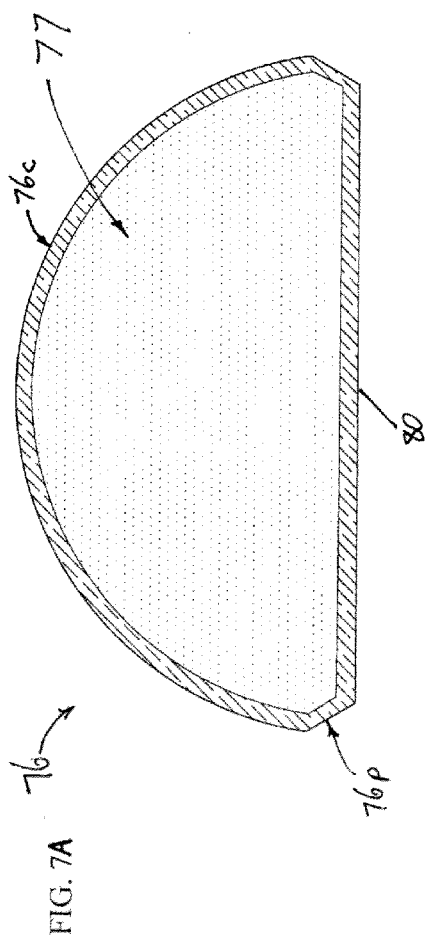
FIG. 6
FIG. 7A

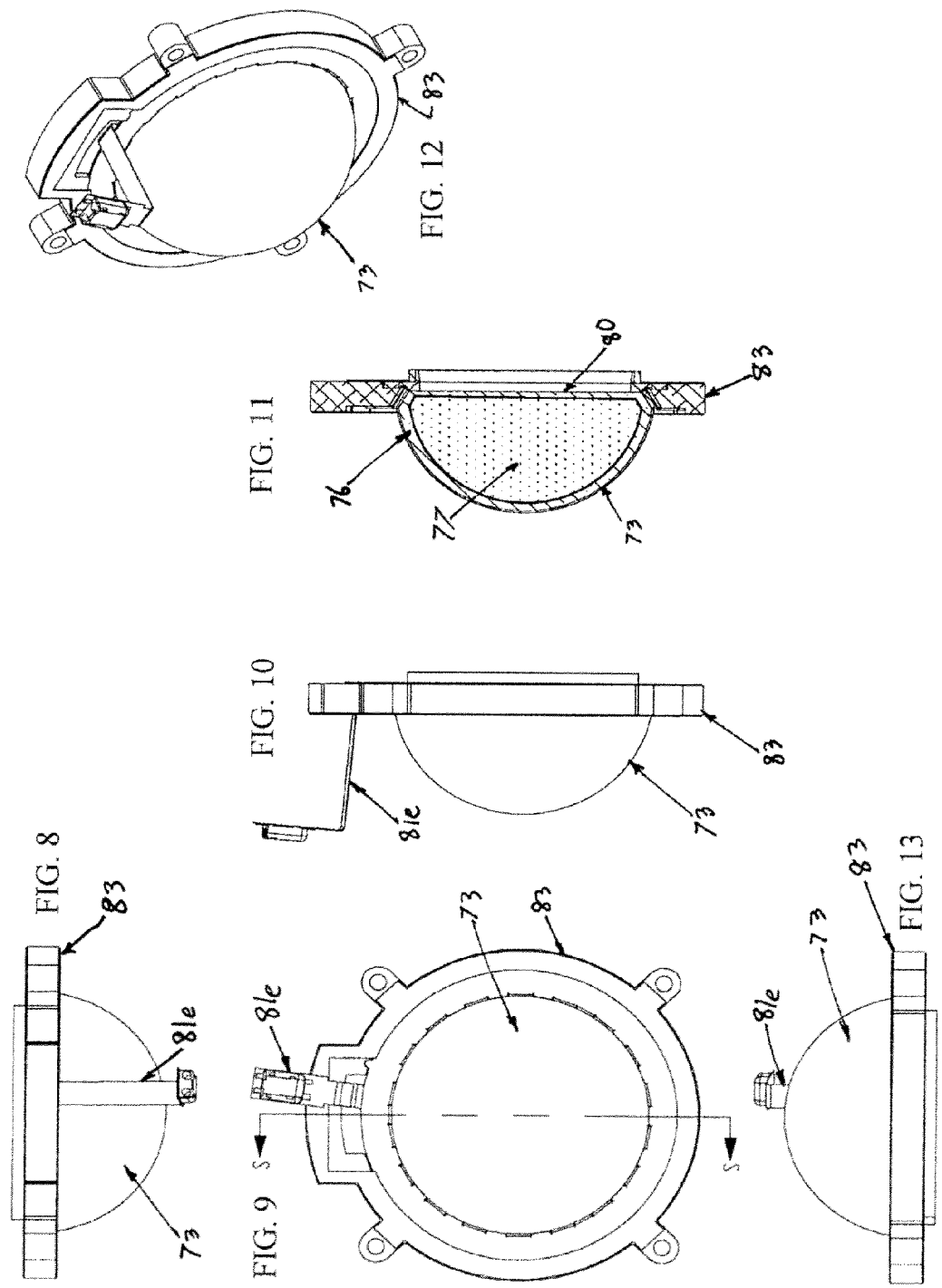

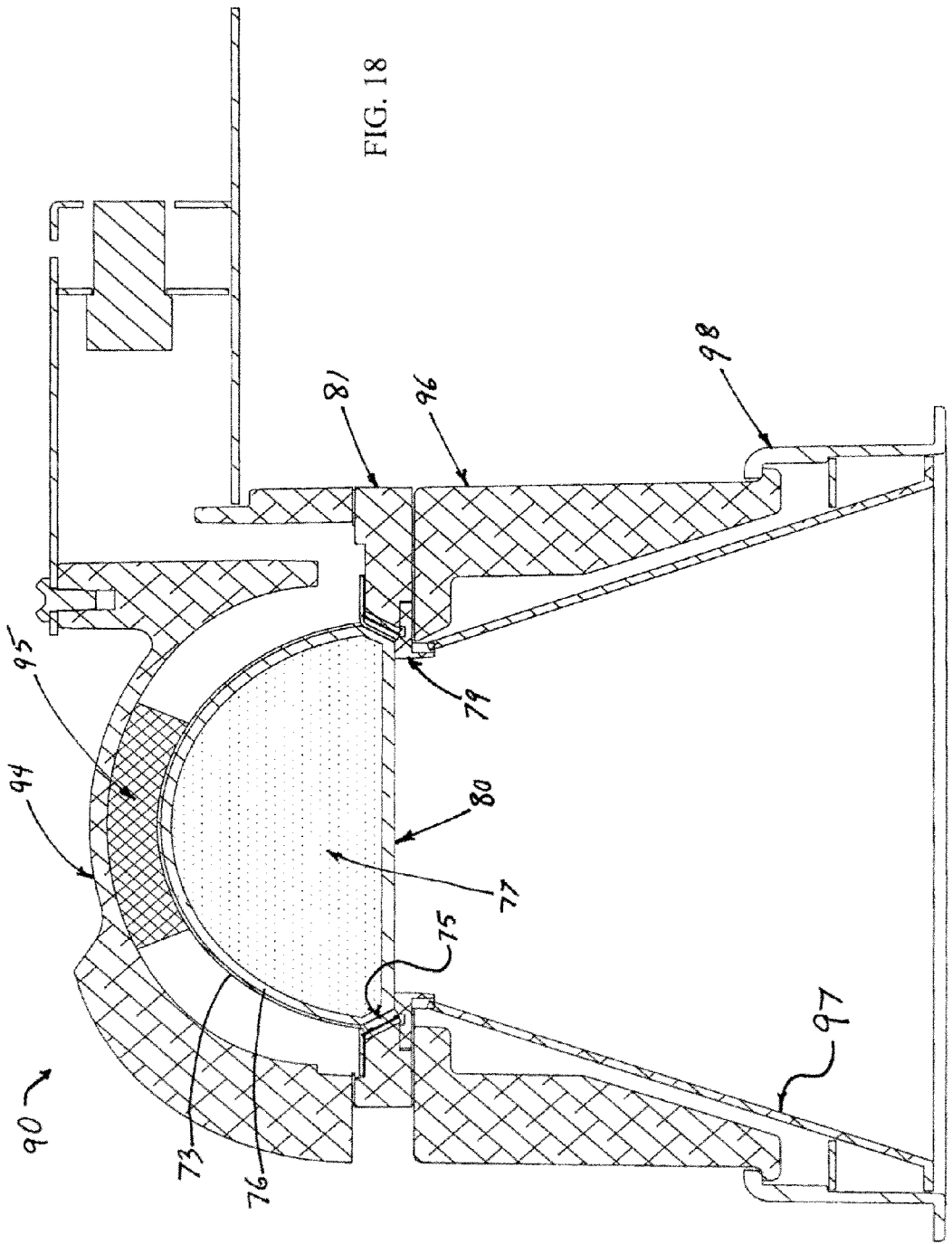

LIGHT FIXTURE USING DOPED SEMICONDUCTOR NANOPHOSPHOR IN A GAS

RELATED APPLICATIONS

This application is a continuation in part of U.S. application Ser. No. 12/609,523 Filed Oct. 30, 2009 entitled "Heat Sinking and Flexible Circuit Board, for Solid State Light Fixture Utilizing an Optical Cavity," which is a continuation in part of U.S. application Ser. No. 12/434,248 Filed May 1, 2009 entitled "Heat Sinking and Flexible Circuit Board, for Solid State Light Fixture Utilizing an Optical Cavity," the disclosures of which are entirely incorporated herein by reference.

This application is also a continuation in part of U.S. application Ser. No. 12/629,614 Filed Dec. 2, 2009 entitled "Light Fixture Using Near UV Solid State Device and Remote Semiconductor Nanophosphors to Produce White Light," the disclosure of which also is entirely incorporated herein by reference.

This application is also a continuation in part of U.S. application Ser. No. 12/697,596 Filed Feb. 1, 2010 entitled "Lamp Using Solid State Source and Doped Semiconductor Nanophosphor," the disclosure of which also is entirely incorporated herein by reference.

TECHNICAL FIELD

The present subject matter relates to light fixtures and systems incorporating such fixtures, where such a fixture utilizes one or more doped semiconductor nanophosphors in a gas, to produce light of desired characteristics.

BACKGROUND

As costs of energy increase along with concerns about global warming due to consumption of fossil fuels to generate energy, there is an ever increasing need for more efficient lighting technologies. These demands, coupled with rapid improvements in semiconductors and related manufacturing technologies, are driving a trend in the lighting industry toward the use of light emitting diodes (LEDs) or other solid state light sources to produce light for general lighting applications, as replacements for incandescent lighting and eventually as replacements for other older less efficient light sources.

The actual solid state light sources, however, produce light of specific limited spectral characteristics. To obtain white light of a desired characteristic and/or other desirable light colors, one approach uses sources that produce light of two or more different colors or wavelengths and one or more optical processing elements to combine or mix the light of the various wavelengths to produce the desired characteristic in the output light. In recent years, techniques have also been developed to shift or enhance the characteristics of light generated by solid state sources using phosphors, including for generating white light using LEDs. Phosphor based techniques for generating white light from LEDs, currently favored by LED manufacturers, include UV or Blue LED pumped phosphors. In addition to traditional phosphors, semiconductor nanophosphors have been used more recently. The phosphor materials may be provided as part of the LED package (on or in close proximity to the actual semiconductor chip), or the phosphor materials may be provided remotely (e.g. on or in association with a macro optical processing element such as a diffuser or reflector outside the LED package). The remote phosphor based solutions have advantages, for example, in that the color characteristics of the fixture output are more repeatable, whereas solutions using sets of different color LEDs and/or lighting fixtures with the phosphors inside the LED packages tend to vary somewhat in light output color from fixture to fixture, due to differences in the light output properties of different sets of LEDs (due to lax manufacturing tolerances of the LEDs).

Although these solid state lighting technologies have advanced considerably in recent years, there is still room for further improvement. For example, there is always a need for techniques to still further improve efficiency of solid state lighting fixtures or systems, to reduce energy consumption. Also, for general lighting applications, it is desirable to consistently provide light outputs of acceptable characteristics in a consistent repeatable manner from one fixture to the next. In white light applications, for example, it is desirable for fixtures of a particular design to consistently produce white light of a desired color rendering index and/or color temperature.

SUMMARY

The teachings herein provide further improvements over the existing light fixture technologies. One or more semiconductor nanophosphors, typically doped semiconductor nanophosphors, are dispersed in a gas remotely positioned in or around an optic of a light fixture so as to be excited by electromagnetic energy from an appropriate source. Although other sources might be used, such as a mercury vapor lamp providing UV energy, the sources of energy to pump the nanophosphors discussed in the examples comprise one or more solid state sources, typically one or more light emitting diodes rated to emit energy at one or more wavelengths in a range or spectrum of absorption by the nanophosphor(s).

For example, a light fixture might include a solid state source for producing electromagnetic energy of a first emission spectrum and a container, at least partially formed of an optically transmissive material, coupled to receive electromagnetic energy from the solid state source. A gas fills an interior volume of the container. The fixture also includes a semiconductor nanophosphor dispersed in the gas in the container. The semiconductor nanophosphor has an absorption spectrum encompassing at least a substantial portion of the first emission spectrum. When excited by electromagnetic energy in the absorption spectrum, received from the solid state source, the semiconductor nanophosphor emits visible light in a second emission spectrum that is separated from the absorption spectrum of the nanophosphor, for inclusion in a light output for the fixture.

In specific examples discussed in the detailed description, the gas comprises one gas or a combination of gases each selected from the group consisting of: hydrogen gas, inert gases and hydrocarbon based gases. A variety of different types of nanophosphors may be used, alone or in various combinations. Several disclosed examples used two or more nanophosphors, where each nanophosphor is a doped semiconductor nanophosphor. The gas with the semiconductor nanophosphor dispersed therein may appear at least substantially clear when the solid state source is off.

The absorption spectra of several exemplary doped semiconductor nanophosphors exhibit upper limits at approximately 460 nm (nanometers) or below. In examples using one or more of these types of nanophosphors, the solid state source comprises a light emitting diode (LED) rated for producing electromagnetic energy of a wavelength in the range of 460 nm and below. For example, the LED may be rated for producing near UV electromagnetic energy, such as a rated wavelength in the range of 380-420 nm. A specific LED device discussed in several examples is a 405 nm device.

Examples using two, three or more nanophosphors may be configured to produce a visible light output from the fixture that is at least substantially white. Examples are disclosed that produce a white light output having a color rendering index (CRI) of 75 or higher. Selection of the nanophosphor types used in a particular fixture allows design of the fixture to produce a light output having a color temperature in one of the following ranges: 2,725±145° Kelvin; 3,045±175° Kelvin; 3,465±245° Kelvin; and 3,985±275° Kelvin.

The gas bearing the nanophosphors may be remotely deployed, that is to say outside the package(s) of the LED(s) or other solid state elements forming the source. A variety of remote deployments are discussed below by way of example. In several such examples, the fixture includes a reflector having a diffusely reflective surface forming an optical integrating cavity. The reflector receives and diffusely reflects the visible light emitted by the doped semiconductor nanophosphors to produce an integrated light output. The emission spectrum of the output includes visible light of the emission spectra of the various nanophosphors dispersed in the gas. The container may be coupled to the cavity in different ways, but in one specific example, the container with the gas fills at least a substantial portion of the optical integrating cavity.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIG. 6 is a cross-sectional view of an example of a LED type light engine or fixture, having an gas-filled optical integrating cavity, where the nanophosphors are dispersed in the gas in the cavity.

FIG. 7A is a cross-sectional view of a light transmissive container structure, filled with the nanophosphor bearing gas, as used in the light engine or fixture of FIG. 6.

FIGS. 8 to 13 are various other views of the LED type light engine or fixture of FIG. 6.

FIG. 18 a cross-sectional view of a light incorporating the engine or fixture of FIG. 6 with housing components and a secondary optic, in this case, a reflector coupled to the aperture.

DETAILED DESCRIPTION

Figure 1:
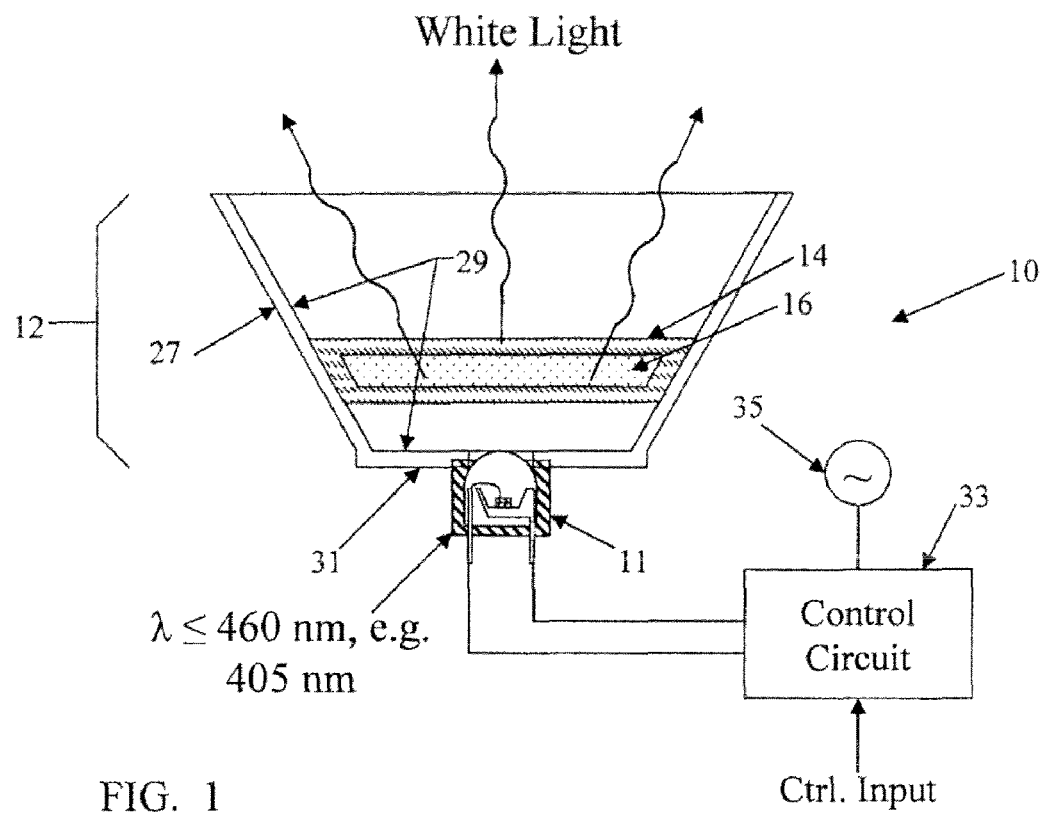
FIG. 1 illustrates an example of a light emitting system, with certain elements thereof shown in cross-section.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various lighting systems, light fixtures and associated light generation techniques discussed in detail by way of examples herein relate to efficient generation and output of light, for example, visible white light of characteristics that are highly desirable in general lighting applications, using a solid state source and one or more semiconductor nanophosphors dispersed in a gas contained in the fixture. Nanophosphors used in the specific example are doped semiconductor nanophosphors. The gas and semiconductor nanophosphor are remotely deployed, for example, at a remote location in or around a macro optical element (optic) such as a window, a reflector, a diffuser, an optical integrating cavity, etc. of the light fixture. Although in most of the specific examples, the optic includes at least one reflector, the term "optic" is meant to broadly encompass a wide variety of macro optical elements that may be coupled, alone or in combination with other macro elements, to process electromagnetic energy supplied by the solid state source(s).

Before discussing structural examples, it may be helpful to discuss the types of phosphors of interest here. Semiconductor nanophosphors are nanoscale crystals or "nanocrystals" formed of semiconductor materials, which exhibit phosphorescent light emission in response to excitation by electromagnetic energy of an appropriate input spectrum (excitation or absorption spectrum). Examples of such nanophosphors include quantum dots (q-dots) formed of semiconductor materials. Like other phosphors, quantum dots and other semiconductor nanophosphors absorb light of one wavelength band and re-emit light at a different band of wavelengths. However, unlike conventional phosphors, optical properties of the semiconductor nanophosphors can be more easily tailored, for example, as a function of the size of the nanocrystals. In this way, for example, it is possible to adjust the absorption spectrum and/or the emission spectrum of the semiconductor nanophosphors by controlling crystal formation during the manufacturing process so as to change the size of the nanocrystals. For example, nanocrystals of the same material, but with different sizes, can absorb and/or emit light of different colors. For at least some semiconductor nanophosphor materials, the larger the nanocrystals, the redder the spectrum of re-emitted light; whereas smaller nanocrystals produce a bluer spectrum of re-emitted light.

Doped semiconductor nanophosphors are somewhat similar in that they are nanocrystals formed of semiconductor materials. However, this later type of semiconductor phosphors are doped, for example, with a transition metal or a rare earth metal. The doped semiconductor nanophosphors used in the exemplary solid state light emitting devices discussed herein are configured to convert energy in a range somewhere in the spectrum at about 460 nm and below into wavelengths of light, which produce a desirable characteristic of visible light for the fixture output. A number of specific examples produce high CRI visible white light emission.

Semiconductor nanophosphors, including doped semiconductor nanophosphors, may be grown by a number of techniques. For example, colloidal nanocrystals are solution-grown, although non-colloidal techniques are possible.

For some lighting applications where a single color is desirable rather than white, the fixture might use a single type of nanophosphor in the material. For a yellow 'bug lamp' type application, for example, the one nanophosphor would be of a type that produces yellow emission in response to pumping energy from the solid state source. For a red light type application, as another example, the one nanophosphor would be of a type that produces predominantly red light emission in response to pumping energy from the solid state source. Many examples, however, will include two, three or more nanophosphors dispersed in the gas, so that the emissions spectra of the nanophosphors may be combined to produce an overall emission spectra in the fixture output that is desirable for a particular lighting application.

For a high CRI type white light application, a gas medium containing or otherwise including semiconductor nanophosphors, of the type discussed in the examples herein, would contain several different types of semiconductor nanocrystals sized and/or doped so as to be excited by the light energy in the relevant part of the spectrum. In several examples, absorption spectra have upper limits somewhere between 430 and 460 nm (nanometers), and the fixtures use LEDs rated to emit light in a comparable portion of the spectrum. The different types of nanocrystals (e.g. semiconductor material, crystal size and/or doping properties) in the mixture are selected by their emission spectra, so that together the excited nanophosphors provides the high CRI white light of a rated color temperature when all are excited by the energy from the relevant type of solid state source. Relative proportions in the mixture may also be chosen to help produce the desired output spectrum for a particular fixture applications.

Doped semiconductor nanophosphors exhibit a relatively large Stokes shift, from lower wavelength of absorption spectra to higher wavelength emissions spectra. In several specific white light examples, each of the phosphors is of a type excited in response to near UV electromagnetic energy in the range of 380-420 nm and/or UV energy in a range of 380 nm and below. Each type of nanophosphor re-emits visible light of a different spectral characteristic, and each of the phosphor emission spectra has little or no overlap with excitation or absorption ranges of the nanophosphors dispersed in the gas. Because of the magnitudes of the shifts, the emissions are substantially free of any overlap with the absorption spectra of the phosphors, and re-absorption of light emitted by the phosphors can be reduced or eliminated, even in applications that use a mixture of a number of such phosphors to stack the emission spectra thereof so as to provide a desired spectral characteristic in the combined light output.

Reference now is made in detail to the examples illustrated in the accompanying drawings and discussed below.

FIG. 1 is a simplified illustration of a lighting system 10, for emitting visible light, so as to be perceptible by a person. A fixture portion of the system is shown in cross-section (although some cross-hatching thereof has been omitted for ease of illustration). The circuit elements are shown in functional block form. The system 10 utilizes a solid state source 11, rated for emitting electromagnetic energy at a wavelength in the range of 460 nm and below ($\lambda \leq 460$ nm). Of course, there may be any number of solid state sources 11, as deemed appropriate to produce the desired level of output for the system 10 for any particular intended lighting application.

The solid state source 11 is a semiconductor based structure for emitting electromagnetic energy. The structure includes a semiconductor chip, such as a light emitting diode (LED), a laser diode or the like, within a package or enclosure. A glass or plastic portion of the package that encloses the chip allows for emission of the electromagnetic energy in the desired direction. Many such source packages include internal reflectors to direct energy in the desired direction and reduce internal losses. To provide readers a full understanding, it may help to consider a simplified example of the structure of such a solid state source 11.

Figure 2:
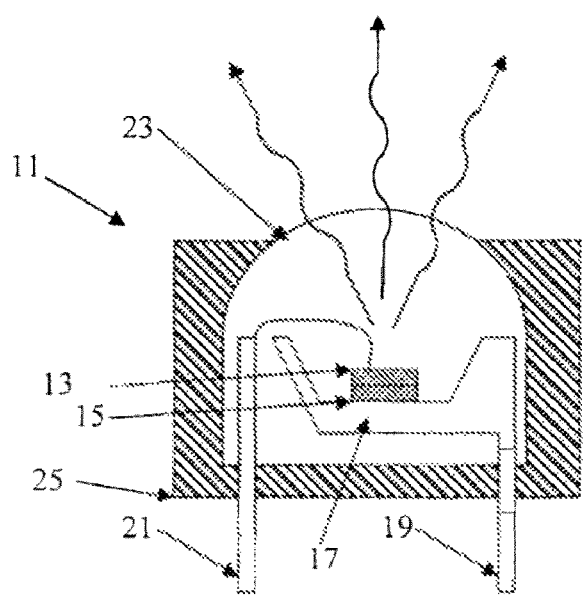
FIG. 2 is a simplified cross-sectional view of a light-emitting diode (LED) type solid state source, which may be used as the source in the system of FIG. 1.

FIG. 2 illustrates a simple example of a LED type solid state source 11, in cross section. In the example of FIG. 2, the source 11 includes at least one semiconductor chip, each comprising two or more semiconductor layers 13, 15 forming the actual LED device. The semiconductor layers 13, 15 of the chip are mounted on an internal reflective cup 17, formed as an extension of a first electrode, e.g. the cathode 19. The cathode 19 and an anode 21 provide electrical connections to layers of the semiconductor chip device within the packaging for the source 11. In the example, an epoxy dome 23 (or similar transmissive part) of the enclosure allows for emission of the electromagnetic energy from the chip in the desired direction.

In this simple example, the solid state source 11 also includes a housing 25 that completes the packaging/enclosure for the source. Typically, the housing 25 is metal, e.g. to provide good heat conductivity so as to facilitate dissipation of heat generated during operation of the LED. Internal "micro" reflectors, such as the reflective cup 17, direct energy in the desired direction and reduce internal losses. Although one or more elements in the package, such as the reflector 17 or dome 23 may be doped or coated with phosphor materials, phosphor doping integrated in (on or within) the package is not required for remote semiconductor nanophosphor implementations as discussed herein. The point here at this stage of our discussion is that the solid state source 11 is rated to emit electromagnetic energy of a wavelength in the range of 460 nm and below, such as 405 nm in the illustrated example.

Semiconductor devices such as the solid state source 11 exhibit emission spectra having a relatively narrow peak at a predominant wavelength, although some such devices may have a number of peaks in their emission spectra. Often, manufacturers rate such devices with respect to the intended wavelength $\lambda$ of the predominant peak, although there is some variation or tolerance around the rated value, from device to device. Solid state light source devices such as device 11 for use in a lighting system 10 will have a predominant wavelength λ in the range at or below 460 nm (λ≦460 nm), for example at 405 nm (λ=405 nm) which is in the 380-420 nm near UV range. A LED used as solid state source 11 in the examples of FIGS. 1 and 2 that is rated for a 405 nm output, will have a predominant peak in its emission spectra at or about 405 nm (within the manufacturer's tolerance range of that rated wavelength value). The system 10, however, may use devices that have additional peaks in their emission spectra.

The structural configuration of the solid state source 11 shown in FIG. 2 is presented here by way of example only. Those skilled in the art will appreciate that the system 10 can utilize any solid state light emitting device structure, where the device is configured as a source of electromagnetic energy in the relevant wavelength range, for example, having substantial energy emissions in that range λ≦460 nm, such as a predominant peak at or about 405 nm. However, as will become apparent from the discussion below, the emission spectrum of the solid state source 11 will be within the absorption spectrum of each of the one or more semiconductor nanophosphors used in the fixture of the particular system 10.

Returning to FIG. 1, the system 10 utilizes a macro scale optic 12 together with the solid state source 11 to form a light fixture. The light fixture could be configured for a general lighting application. Examples of general lighting applications include downlighting, task lighting, "wall wash" lighting, emergency egress lighting, as well as illumination of an object or person in a region or area intended to be occupied by one or more people. A task lighting application, for example, typically requires a minimum of approximately 20 footcandles (fcd) on the surface or level at which the task is to be performed, e.g. on a desktop or countertop. In a room, where the light fixture is mounted in or hung from the ceiling or wall and oriented as a downlight, for example, the distance to the task surface or level can be 35 inches or more below the output of the light fixture. At that level, the light intensity will still be 20 fcd or higher for task lighting to be effective. Of course, the fixture (11, 12) of FIG. 1 may be used in other applications, such as vehicle headlamps, flashlights, etc.

The macro scale optical processing element or 'optic' 12 in this first example includes a macro (outside the packaging of source 11) scale reflector 27. The reflector 27 has a reflective surface 29 arranged to receive at least some electromagnetic energy from the solid state source 11 and/or a remote semiconductor nanophosphor material 16. The disclosed system 10 may use a variety of different structures or arrangements for the reflector 27. For efficiency, the reflective surface 29 of the reflector 27 should be highly reflective. The reflective surface 29 may be specular, semi or quasi specular, or diffusely reflective.

In the example, the emitting region of the solid state source 11 fits into or extends through an aperture in a proximal section 31 of the reflector 27. The solid state source 11 may be coupled to the reflector 27 in any manner that is convenient and/or facilitates a particular lighting application of the system 10. For example, the source 11 may be within the volume of the reflector 27, the source may be outside of the reflector (e.g. above the reflector in the illustrated orientation) and facing to emit electromagnetic energy into the interior of the reflector, or the electromagnetic energy may be coupled from the solid source 11 to the reflector 27 via a light guide or pipe or by an optical fiber. However, close efficient coupling is preferable.

The macro optic 12 will include or have associated therewith a container formed of an optically transmissive material, at least where pumping energy will enter the container and where light will emerge from the container as light output for the system fixture. The container is filled with a gas, and the gas has one or more semiconductor nanophosphors dispersed therein, e.g. in suspension in the gas. Although associated with the optic, the phosphors are located apart from the semiconductor chip of the source or sources 11 used in the particular system 10. Hence, in the first system 10, the fixture includes a container 14 associated with the optic 12. The interior of the container 14 is filled with a nanophosphor bearing gas. In the cross-section portion of the drawing, the gas and nanophosphors are represented at 16 by the dotted hatching.

The gas medium preferably exhibits high transmissivity and/or low absorption to light of the relevant wavelengths, although it may be transparent or somewhat translucent. Various gases may be suitable. Exemplary gases include hydrogen gas, clear inert gases and clear hydrocarbon based gases; and two or more gases selected from this group may be combined to form the gaseous medium for bearing the nanophosphors as shown at 16 in FIG. 1.

In this example, the entire container is optically transmissive. The material forming the walls of the container 14 also may exhibit high transmissivity and/or low absorption to light of the relevant wavelengths. The walls of the container 14 may be smooth and highly transparent or translucent, and/or one or more surfaces may have an etched or roughened texture. Of course, some portions may be reflective, e.g. along the sidewalls in the illustrated example.

As outlined above, the one or more semiconductor nanophosphors dispersed in the gas shown at 16 are of types or configurations (e.g. selected types of doped semiconductor nanophosphors) excitable by the relevant spectrum of energy from the solid state source 11. In the illustrated example, the nanophosphor(s) may have absorption spectra that include some or all of the near UV range, in particular the 405 nm emission spectrum of the exemplary LED source 11. When excited by electromagnetic energy in the absorption spectrum from the solid state source, each semiconductor nanophosphor emits visible light in a characteristic emission spectrum that is separated from the absorption spectrum of the nanophosphor, for inclusion in a light output for the fixture.

The upper limits of the absorption spectra of the exemplary nanophosphors are all at or below 460 nm, for example, around 430 nm. However, the exemplary nanophosphors are relatively insensitive to other ranges of visible light often found in natural or other ambient white visible light. Hence, when the lighting system 10 is off, the semiconductor nanophosphor will exhibit little or not light emissions that might otherwise be perceived as color by a human observer. Even though not emitting, the particles of the doped semiconductor nanophosphor may have some color, but due to their small size and dispersion in the gas, the overall effect is that the gas and nanophosphor material 16 appears at least substantially clear to the human observer, that is to say it has little or no perceptible tint.

As noted, one or two of the nanophosphors may be used in the gas at 16 to produce a relatively mono-chromatic light output or a light output that appears somewhat less than full white to a person. However, in many commercial examples for general lighting or the like, the fixture produces white light of desirable characteristics using a number of semiconductor nanophosphors, and further discussion of the examples including that of FIG. 1 will concentrate on such white light implementations.

Hence for further discussion of this example, we will assume that the container 14 is filled with a gaseous material 16 bearing a number of different semiconductor nanophosphors dispersed in the gas. Also, for further discussion, we will assume that the solid state source 11 is a near UV emitting LED, such as 405 nm LEDs or other type of LED rated to emit somewhere in the wavelength range of 380-420 nm. Although other types of semiconductor nanophosphors are contemplated, we will also assume that each nanophosphor is a doped semiconductor of a type excited in response to near UV electromagnetic energy from the LEDs 11 of the solid state source.

When so excited, each doped semiconductor nanophosphor in the white light fixture re-emits visible light of a different spectrum. However, each such emission spectrum has substantially no overlap with absorption spectra of the doped semiconductor nanophosphors. When excited by the electromagnetic energy received from the LEDs 11, the doped semiconductor nanophosphors together produce visible light output for the light fixture of a desired characteristic, through the exterior surface(s) of the container and the output end of the reflector 27.

In an example of a white light type example of the system 10, the excited nanophosphors together produce output light that is at least substantially white and has a color rendering index (CRI) of 75 or higher. The fixture output light produced by this excitation of the semiconductor nanophosphors exhibits color temperature in one of several desired ranges along the black body curve. Different light fixtures designed for different color temperatures of white output light would use different formulations of mixtures of doped semiconductor nanophosphors. The white output light of the system 10 exhibits color temperature in one of four specific ranges along the black body curve listed in Table 1 below.

TABLE 1

Nominal Color Temperatures and Corresponding Color Temperature Ranges

| Nominal Color Temp. (° Kelvin) | Color Temp. Range (° Kelvin) |
|---|---|
| 2700 | 2725 ± 145 |
| 3000 | 3045 ± 175 |
| 3500 | 3465 ± 245 |
| 4000 | 3985 ± 275 |

Figure 1A:
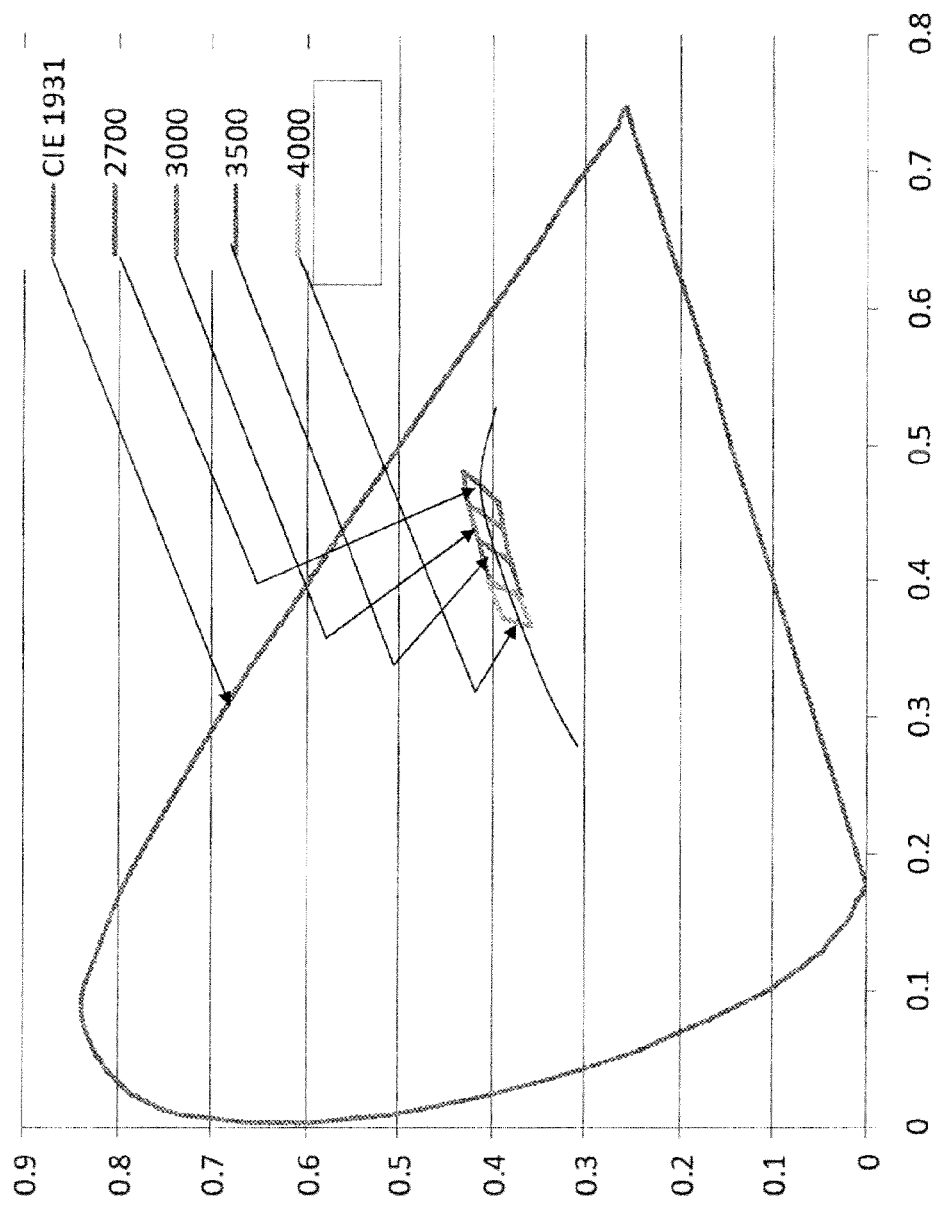
FIG. 1A is a color chart showing the black body curve and tolerance quadrangles along that curve for chromaticities corresponding to several color temperature ranges that are desirable in many general lighting applications.

In Table 1, each nominal color temperature value represents the rated or advertised temperature as would apply to particular lamp products having an output color temperature within the corresponding range. The color temperature ranges fall along the black body curve. FIG. 1A shows the outline of the CIE 1931 color chart, and the curve across a portion of the chart represents a section of the black body curve that includes the desired CIE color temperature (CCT) ranges. The light may also vary somewhat in terms of chromaticity from the coordinates on the black body curve. The quadrangles shown in the drawing represent the respective ranges of chromaticity for the nominal CCT values. Each quadrangle is defined by the range of CCT and the distance from the black body curve. Table 2 below provides chromaticity specifications for the four color temperature ranges. The x, y coordinates define the center points on the black body curve and the vertices of the tolerance quadrangles diagrammatically illustrated in the color chart of FIG. 1A.

TABLE 2

Chromaticity Specification for the Four Nominal Values/CCT Ranges

| | CCT Range | | | | | | | |
|---|---|---|---|---|---|---|---|---|
| | 2725 ± 145 | | 3045 ± 175 | | 3465 ± 245 | | 3985 ± 275 | |
| | Nominal CCT | | | | | | | |
| | 2700° K | | 3000° K | | 3500° K | | 4000° K | |
| | x | y | x | y | x | y | x | y |
| Center point | 0.4578 | 0.4101 | 0.4338 | 0.4030 | 0.4073 | 0.3917 | 0.3818 | 0.3797 |
| Tolerance Quadrangle | 0.4813 | 0.4319 | 0.4562 | 0.4260 | 0.4299 | 0.4165 | 0.4006 | 0.4044 |
| | 0.4562 | 0.426 | 0.4299 | 0.4165 | 0.3996 | 0.4015 | 0.3736 | 0.3874 |
| | 0.4373 | 0.3893 | 0.4147 | 0.3814 | 0.3889 | 0.369 | 0.367 | 0.3578 |
| | 0.4593 | 0.3944 | 0.4373 | 0.3893 | 0.4147 | 0.3814 | 0.3898 | 0.3716 |

The solid state lighting system 10 could use a variety of different combinations of semiconductor nanophosphors to produce such an output. Examples of suitable materials are available from NN Labs of Fayetteville, Ark. In a specific example, one or more of the doped semiconductor nanophosphors comprise zinc selenide quantum dots doped with manganese or copper. The selection of one or more such nanophosphors excited mainly by the low end (460 nm or below) of the visible spectrum and/or by UV energy together with dispersion of the nanophosphors in an otherwise clear gas minimizes any potential for discolorization of the fixture when the system 10 in its off-state that might otherwise be caused by the presence of a phosphor material.

Figure 3:
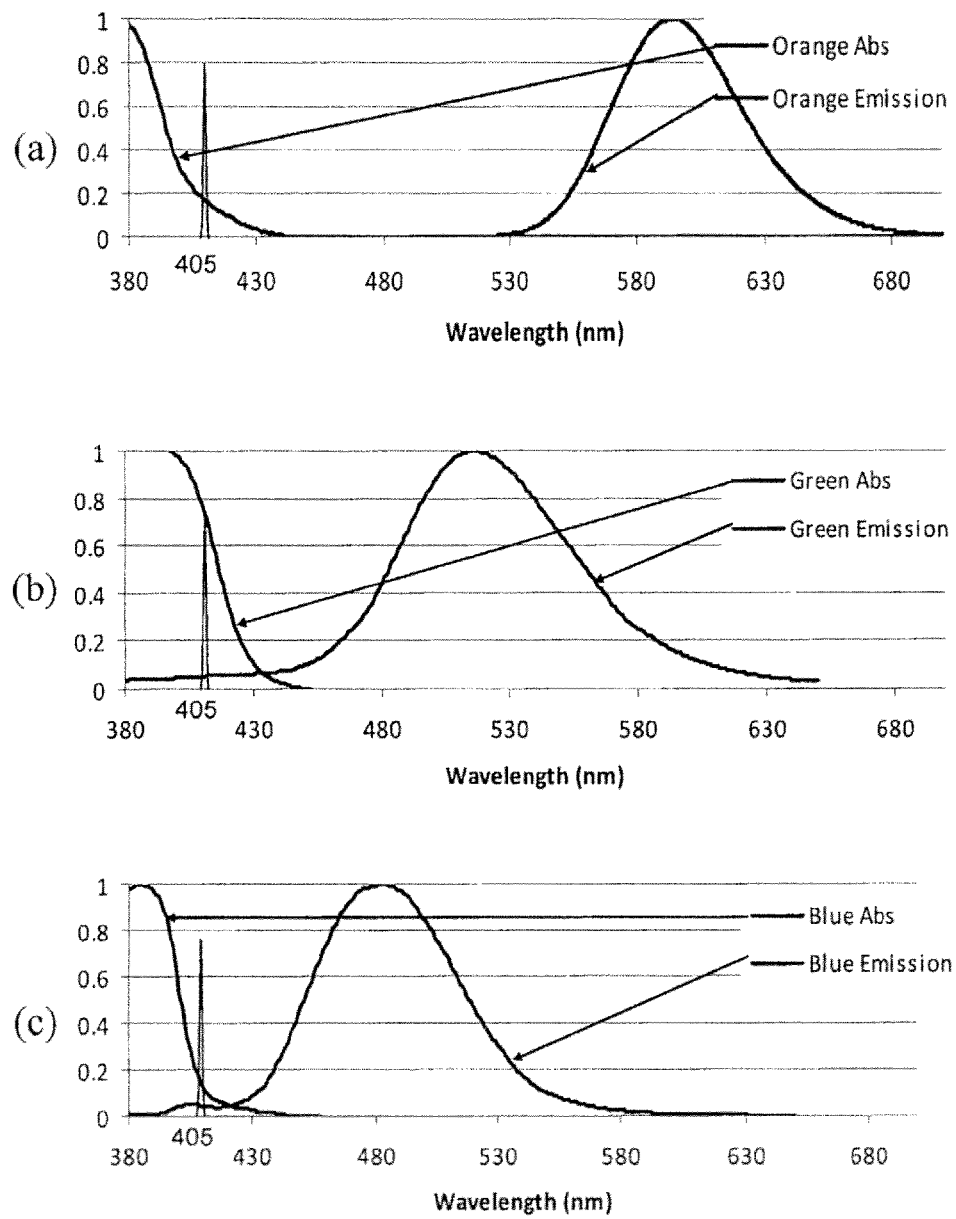
FIG. 3 is a graph of absorption and emission spectra of a number of doped semiconductor nanophosphors.

Doped semiconductor nanophosphors exhibit a large Stokes shift, that is to say from a short-wavelength range of absorbed energy up to a fairly well separated longer-wavelength range of emitted light. FIG. 3 shows the absorption and emission spectra of three examples of doped semiconductor nanophosphors. Each line of the graph also includes an approximation of the emission spectra of the 405 nm LED chip, to help illustrate the relationship of the 405 nm LED emissions to the absorption spectra of the exemplary doped semiconductor nanophosphors. The illustrated spectra are not drawn precisely to scale but in a manner to provide a teaching example to illuminate our discussion here.

The top line (a) of the graph shows the absorption and emission spectra for an orange emitting doped semiconductor nanophosphor. The absorption spectrum for this first phosphor includes the 380-420 nm near UV range, but that absorption spectrum drops substantially to 0 (has an upper limit) somewhere around or a bit below 450 nm. As noted, the phosphor exhibits a large Stokes shift from the short wavelength(s) of absorbed light to the longer wavelengths of re-emitted light. The emission spectrum of this first phosphor has a fairly broad peak in the wavelength region humans perceive as orange. Of note, the emission spectrum of this first phosphor is well above the illustrated absorption spectra of the other doped semiconductor nanophosphors and well above its own absorption spectrum. As a result, orange emissions from the first doped semiconductor nanophosphor would not re-excite that phosphor and would not excite the other doped semiconductor nanophosphors if mixed together. Stated another way, the orange phosphor emissions would be subject to little or no phosphor re-absorption, even in mixtures containing one or more of the other doped semiconductor nanophosphors.

The next line (b) of the graph in FIG. 3 shows the absorption and emission spectra for a green emitting doped semiconductor nanophosphor. The absorption spectrum for this second phosphor includes the 380-420 nm near UV range, but that absorption spectrum drops substantially to 0 (has an upper limit) about 450 or 460 nm. This phosphor also exhibits a large Stokes shift from the short wavelength(s) of absorbed light to the longer wavelengths of re-emitted light. The emission spectrum of this second phosphor has a broad peak in the wavelength region humans perceive as green. Again, the emission spectrum of the phosphor is well above the illustrated absorption spectra of the other doped semiconductor nanophosphors and well above its own absorption spectrum. As a result, green emissions from the second doped semiconductor nanophosphor would not re-excite that phosphor and would not excite the other doped semiconductor nanophosphors if mixed together. Stated another way, the green phosphor emissions also should be subject to little or no phosphor re-absorption, even in mixtures containing one or more of the other doped semiconductor nanophosphors.

The bottom line (c) of the graph shows the absorption and emission spectra for a blue emitting doped semiconductor nanophosphor. The absorption spectrum tar this third phosphor includes the 380-420 nm near UV range, but that absorption spectrum drops substantially to 0 (has an upper limit) about 450 or 460 nm. This phosphor also exhibits a large Stokes shift from the short wavelength(s) of absorbed light to the longer wavelengths of re-emitted light. The emission spectrum of this third phosphor has a broad peak in the wavelength region humans perceive as blue. The main peak of the emission spectrum of the phosphor is well above the illustrated absorption spectra of the other doped semiconductor nanophosphors and well above its own absorption spectrum. In the case of the blue example, there is just a small amount of emissions in the region of the phosphor absorption spectra. As a result, blue emissions from the third doped semiconductor nanophosphor would re-excite that phosphor at most a minimal amount. As in the other phosphor examples of FIG. 3, the blue phosphor emissions would be subject to relatively little phosphor re-absorption, even in mixtures containing one or more of the other doped semiconductor nanophosphors.

Examples of suitable orange, green and blue emitting doped semiconductor nanophosphors of the types generally described above relative to FIG. 3 are available from NN Labs of Fayetteville, Ark.

As explained above, the large Stokes shift results in negligible re-absorption of the visible light emitted by doped semiconductor nanophosphors. This allows the stacking of multiple phosphors. It becomes practical to select and mix two, three or more such phosphors in a manner that produces a particular desired spectral characteristic in the combined light output generated by the phosphor emissions.

Figure 4A:
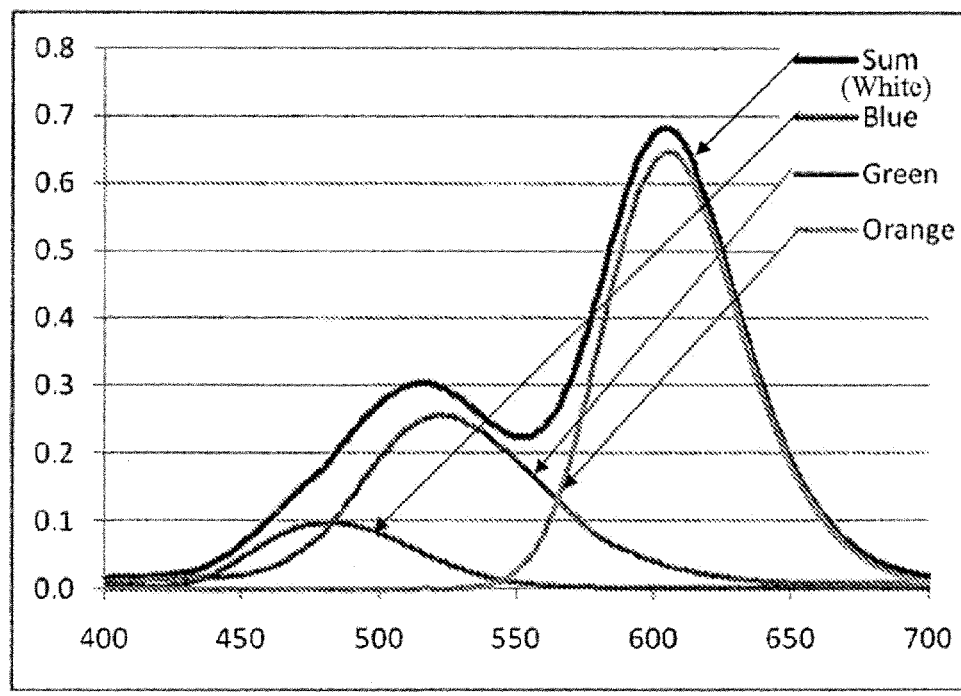
FIG. 4A is a graph of emission spectra of three of the doped semiconductor nanophosphors selected for use in an exemplary solid state light emitting device as well as the spectrum of the white light produced by combining the spectral emissions from those three phosphors.

FIG. 4A graphically depicts emission spectra of three of the doped semiconductor nanophosphors selected for use in an exemplary solid state light fixture as well as the spectrum of the white light produced by summing or combining the spectral emissions from those three phosphors. For convenience, the emission spectrum of the LED has been omitted from FIG. 4A, on the assumption that a high percentage of the 405 nm light from the LED is absorbed by the phosphors. Although the actual output emissions from the fixture may include some near UV light from the LED, the contribution thereof if any to the sum in the output spectrum should be relatively small.

Although other combinations are possible based on the phosphors discussed above relative to FIG. 3 or based on other semiconductor nanophosphor materials, the example of FIG. 4A represents emissions of blue, green and orange phosphors. The emission spectra of the blue, green and orange emitting doped semiconductor nanophosphors are similar to those of the corresponding color emissions shown in FIG. 3. Light is additive. Where the solid state fixture in system 10 includes the blue, green and orange emitting doped semiconductor nanophosphors as shown for example at 27 in FIG. 1, the addition of the blue, green and orange emissions produces a combined spectrum as approximated by the top or 'Sum' curve in the graph of FIG. 4A.

Various mixtures of doped semiconductor nanophosphors will produce white light emissions from solid state light fixtures 12 that exhibit CRI of 75 or higher. For an intended fixture specification, a particular mixture of phosphors is chosen so that the light output of the fixture exhibits color temperature in one of the following specific ranges along the black body curve: 2,725±145° Kelvin; 3,045±175° Kelvin; 3,465±245° Kelvin; and 3,985±275° Kelvin. In the example shown in FIG. 4A, the 'Sum' curve in the graph produced by the mixture of blue, green and orange emitting doped semiconductor nanophosphors would result in a white light output having a color temperature of 2800° Kelvin (within the 2,725±145° Kelvin range). That white output light also would have a CRI of 80 (higher than 75).

It is possible to add one or more additional nanophosphors, e.g. a fourth, fifth, etc., to the mixture to further improve the CRI. For example, to improve the CRI of the nanophosphor mix of FIGS. 3 and 4A, a doped semiconductor nanophosphor might be added to the mix with a broad emissions spectrum that is yellowish-green or greenish-yellow, that is to say with a peak of the phosphor emissions somewhere in the range of 540-570 nm, say at 555 nm.

Figure 4B:
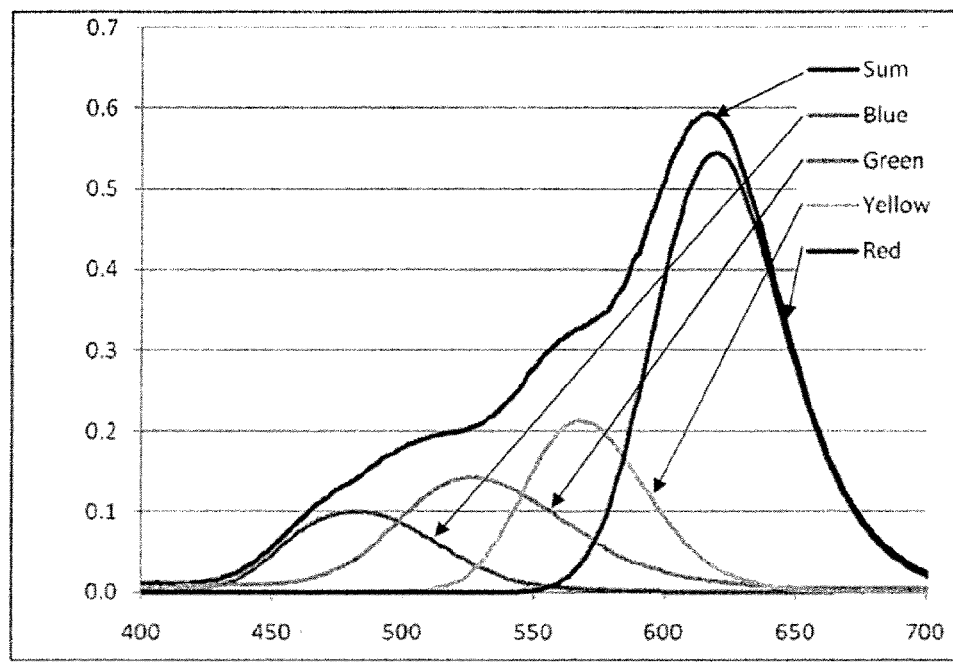
FIG. 4B is a graph of emission spectra of four doped semiconductor nanophosphors, in this case, for red, green, blue and yellow emissions, as the spectrum of the white light produced by combining the spectral emissions from those four phosphors.

Other mixtures also are possible, with two, three or more doped semiconductor nanophosphors. The example of FIG. 4B uses red, green and blue emitting semiconductor nanophosphors, as well as a yellow fourth doped semiconductor nanophosphor. Although not shown, the absorption spectra would be similar to those of the three nanophosphors discussed above relative to FIG. 3. For example, each absorption spectrum would include at least a portion of the 380-420 nm near UV range. All four phosphors would exhibit a large Stokes shift from the short wavelength(s) of absorbed light to the longer wavelengths of re-emitted light, and thus their emissions spectra have little or not overlap with the absorption spectra.

In this example (FIG. 4B), the blue nanophosphor exhibits an emission peak at or around 484 nm, the green nanophosphor exhibits an emission peak at or around 516 nm, the yellow nanophosphor exhibits an emission peak at or around 580, and the red nanophosphor exhibits an emission peak at or around 610 nm. The addition of these blue, green, red and yellow phosphor emissions produces a combined spectrum as approximated by the top or 'Sum' curve in the graph of FIG. 4B. The 'Sum' curve in the graph represents a resultant white light output having a color temperature of 2600° Kelvin (within the 2,725±145° Kelvin range), where that white output light also would have a CRI of 88 (higher than 75).

Returning to FIG. 1, assume that the phosphors in the gas at 16 in the fixture of system 10 include the blue, green and orange emitting doped semiconductor nanophosphors discussed above relative to FIGS. 3 and 4A. As discussed earlier, the exemplary semiconductor LED chip formed by layers 13 and 15 is rated to emit near UV electromagnetic energy of a wavelength in the range of ≦460 nm, such as 405 nm in the illustrated example, which is within the excitation or absorption spectrum of each of the three included phosphors in the mixture shown at 16. When excited, that combination of doped semiconductor nanophosphors re-emits the various wavelengths of visible light represented by the blue, green and orange lines in the graph of FIG. 4A. Combination or addition thereof in the fixture output produces "white" light, which for purposes of our discussion herein is light that is at least substantially white light. The white light emission from the solid state fixture in system 10 exhibits a CRI of 75 or higher (80 in the specific example of FIG. 4A). Also, the light output of the fixture exhibits color temperature of 2800° Kelvin, that is to say within the 2,725±145° Kelvin range. Other combinations of doped semiconductor nanophosphors can be used in a solid state lighting system 10 to produce the high CRI white light in the 3,045±175° Kelvin, 3,465±245° Kelvin, and 3,985±275° Kelvin ranges.

This system 10 provides a "remote" implementation of the semiconductor nanophosphors in that the semiconductor nanophosphors are outside of the package enclosing the actual semiconductor chip or chips and thus are apart or remote from the semiconductor chip(s). The remote semiconductor nanophosphors in the gas may be provided in or about the optic 12 in any of a number of different ways, such as along any suitable portion of the inner reflective surface 29 of the macro reflector 27. Several different locations of the gas with the semiconductor nanophosphors are shown and described with regard to later examples. In the first example of FIG. 1, the container 14 extends across a portion of the volume within the reflector 27 across the path of energy emissions from the source 11 through the optic 12.

At least some semiconductor nanophosphors degrade in the presence of oxygen, reducing the useful life of the semiconductor nanophosphors. Hence, it may be desirable to encapsulate the semiconductor nanophosphor bearing gas 16 in a manner that blocks out oxygen, to prolong useful life or the semiconductor nanophosphors. In the example of FIG. 1, the container 14 therefore may be a sealed glass container, the material of which is highly transmissive and exhibits a low absorption with respect to visible light and the relevant wavelength(s) of near UV energy. The interior of the container 14 is filled with the semiconductor nanophosphor bearing gas material 16. Any of a number of various sealing arrangements may be used to seal the interior once filled, so as to maintain a good oxygen barrier and thereby shield the semiconductor nanophosphors from oxygen.

Figure 5:
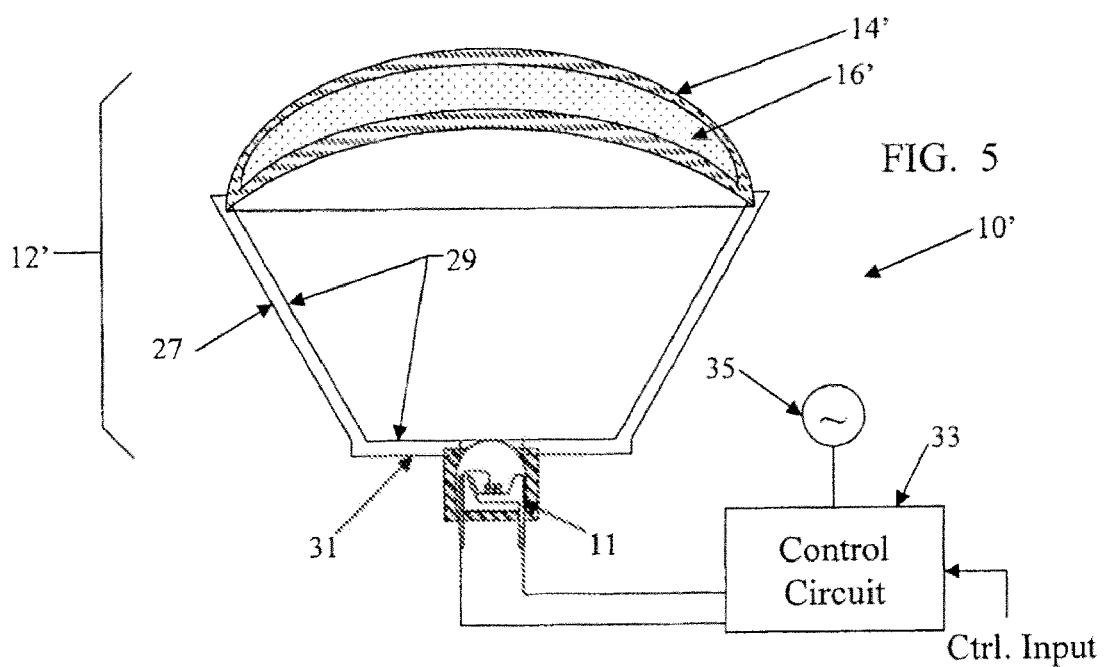
FIG. 5 illustrates an example of a white light emitting system, similar to that of FIG. 1, but using a different configuration/position for the container for the doped semiconductor nanophosphor material.

The container 14 and the semiconductor nanophosphor bearing gas 16 may be located at any convenient distance in relation to the proximal end 31 of the reflector 27 and the solid state source 11. For example, the container 14 and the semiconductor nanophosphor bearing gas 16 could be located adjacent to the proximal end 31 of the reflector 27 (adjacent to that part of the reflective surface 29) and adjacent to the solid state source 11. Alternatively, as shown by the system 10' of FIG. 5, the container 14' and the nanophosphor bearing gas 16' in the optic 12' could be located at or near the distal end of the reflector 27. The container may also have a wide variety of shapes. In the example of FIG. 1, the container 14 is relatively flat and disk-shaped. In the example of FIG. 5, the container 14' has a convex outer curvature, although it could be convex or concave. The inner surface of the container 14' facing toward the solid state source 11 and the reflective surface 29 may be flat, concave or convex (as shown). Those skilled in the art will also recognize that the optic 12 or 12' could include a variety of other optical processing elements, such as a further reflector, one or more lenses, a diffuser, a collimator, etc.

Other container arrangements are contemplated. For example, the reflector 27 might serve as the container. In such an arrangement, the distal end of the reflector would have a transmissive optical aperture for energy to enter from the LED 11, although the material would seal the reflector at that point. The distal end of the reflector 27 might then be sealed to form the container by means of a transmissive plate, lens or diffuser, for example, formed of glass. A glass container might be used shaped like the reflector 27 but having reflective coatings on the appropriate interior surfaces 29. In these cases, the gas bearing the nanophosphors would fill substantially all of the interior volume of the reflector 27.

The lighting system 10 (or 10') also includes a control circuit 33 coupled to the LED type semiconductor chip in the source 11, for establishing output intensity of electromagnetic energy output of the LED source 11. The control circuit 33 typically includes a power supply circuit coupled to a voltage/current source, shown as an AC power source 35. Of course, batteries or other types of power sources may be used, and the control circuit 33 will provide the conversion of the source power to the voltage/current appropriate to the particular one or more LEDs 11 utilized in the system 10 (or 10'). The control circuit 33 includes one or more LED driver circuits for controlling the power applied to one or more sources 11 and thus the intensity of energy output of the source. Intensity of the phosphor emissions are proportional to the intensity of the energy pumping the nanophosphors, therefore control of the LED output controls the intensity of the light output of the fixture. The control circuit 33 may be responsive to a number of different control input signals, for example to one or more user inputs as shown by the arrow in FIG. 1, to turn power ON/OFF and/or to set a desired intensity level for the white light output provided by the system 10.

In the exemplary arrangement of the optic 12 (or 12'), when near UV light energy from the 405 nm sold state source 11 enters the interior volume of the reflector 27 and passes through the outer glass of the container 14 into the gas 16 bearing the semiconductor nanophosphors. Much of the near UV emissions enter the container directly, although some reflect off of the surface 29 and into the container. Within the container 14 or 14', the 405 nm near UV energy excites the semiconductor nanophosphors in material 16 to produce light that is at least substantially white, that exhibits a CRI of 75 or higher and that exhibits color temperature in one of the specified ranges (see table 1 above). Light resulting from the semiconductor nanophosphor excitation, essentially absorbed as near UV energy and reemitted as visible light of the wavelengths forming the desired white light, passes out through the material 16 and the container 14 or 14' in all directions. Some light emerges directly out of the optic 12 as represented by the undulating arrows. However, some of the white light will also reflect off of various parts of the surface 29. Some light may even pass through the container and semiconductor nanophosphor material again before emission from the optic.

In the orientation illustrated in FIGS. 1 and 5, white light from the semiconductor nanophosphor excitation, including any white light emissions reflected by the surface 29 are directed upwards, for example, for lighting a ceiling so as to indirectly illuminate a room or other habitable space below the fixture. The orientation shown, however, is purely illustrative. The optic 12 or 12' may be oriented in any other direction appropriate for the desired lighting application, including downward, any sideways direction, various intermediate angles, etc. Also, the examples of FIGS. 1 and 5 utilize relatively flat reflective surfaces for ease of illustration. Those skilled in the art will recognize, however, that the principles of those examples are applicable to optics of other shapes and configurations, including optics that use various curved reflective surfaces (e.g. hemispherical, semi-cylindrical, parabolic, etc.).

The fixture technology discussed herein, using one or more nanophosphors dispersed in a gas, may be adapted to a variety of different fixture optic structures with various types of reflectors, diffusers or the like. Several additional examples are discussed in some detail in the above incorporated application Ser. Nos. 12/609,523, 12/434,248 and 12/629,614. Other examples of fixtures using containers are discussed in US publication 2009/0296368, although in those examples the gas would replace a liquid media in the containers discussed in that publication.

The examples specifically discussed above relative to FIGS. 1-5 include a reflector 27 forming or as part of the optic 12. Various types of reflectors may be used. It is also contemplated that the reflector might be configured to form an optical integrating cavity. In such an implementation of the fixture, the reflector receives and diffusely reflects the visible light emitted by the doped semiconductor nanophosphors to produce an integrated light output. The emission spectrum of the output includes visible light of the emission spectra of the various nanophosphors dispersed in the gas. The container may be coupled to the cavity in different ways. For example, the container could be at or near the LED inputs to the cavity, at the output aperture of the cavity, at a location on the reflective interior surface forming the cavity. It may be helpful to consider and optical cavity example, in somewhat more details. In the specific example, the container with the gas fills at least a substantial portion of the optical integrating cavity.

Figure 7B:
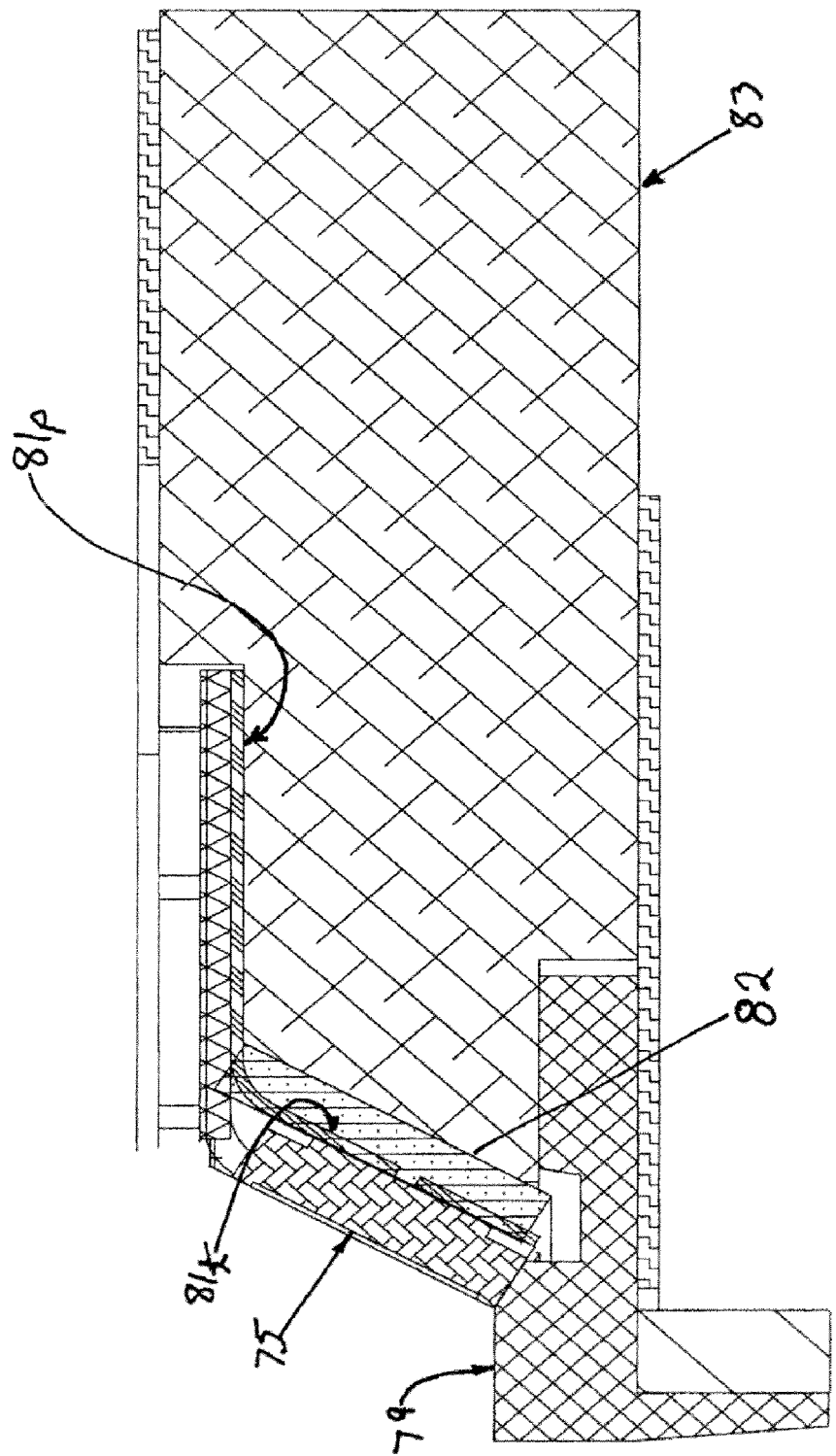
FIG. 7B is an enlarged portion of the cross-section of the fixture or light engine of FIG. 6, showing several elements of the or light engine fixture in more detail.
Figure 17:
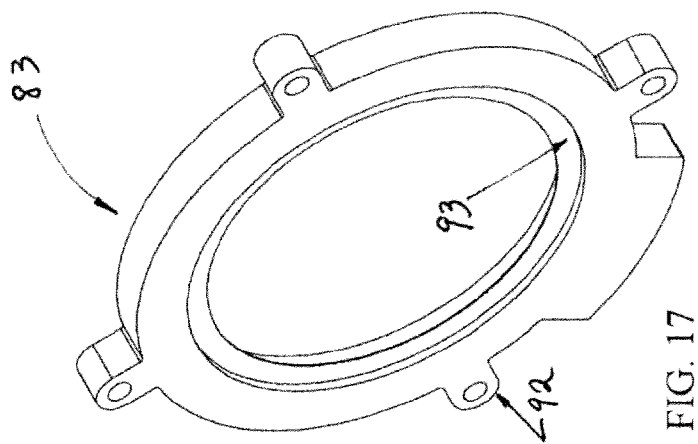
FIG. 17 an isometric view of the bottom of the heat sink ring of FIG. 14.
Figure 16:
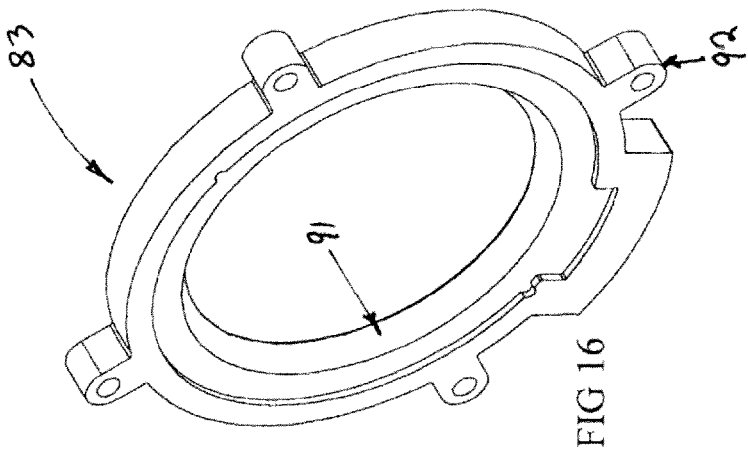
FIG. 16 an isometric view of the top of the heat sink ring of FIG. 14.
Figure 15:
FIG. 15 is a side view of the heat sink ring of FIG. 14.
Figure 14:
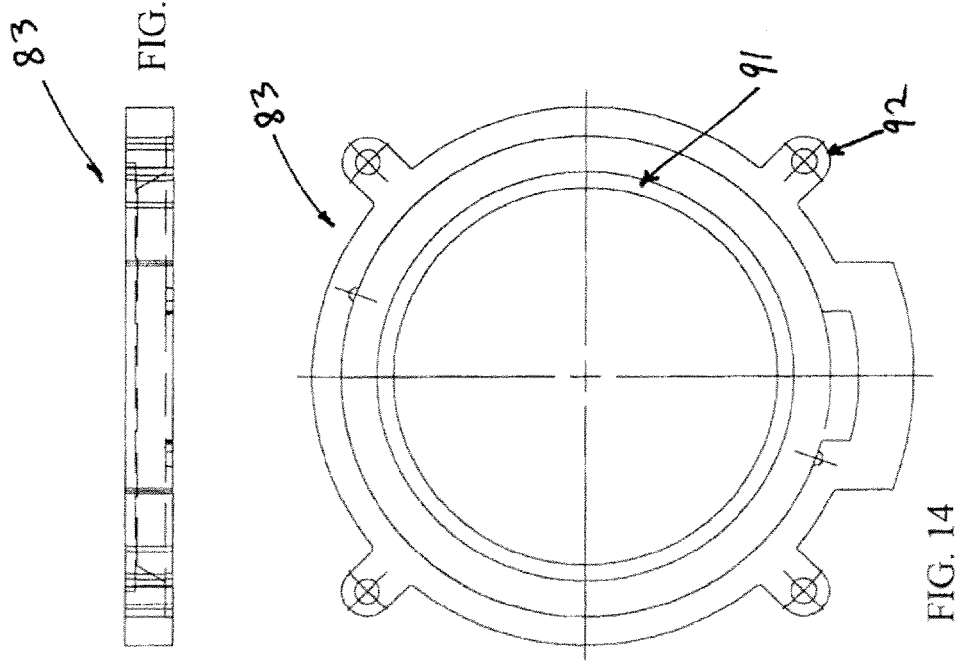
FIG. 14 is a top plan view of the heat sink ring of the LED type light engine or fixture of FIG. 6.

FIG. 6 is a cross-section of another example of a light fixture or engine 71 intended for general lighting, for example, in a region or area intended to be occupied by a person. FIG. 7A is a cross-sectional view of a one-piece solid construction of the light transmissive structure 76 that forms the optical volume 72, in the fixture or engine 71 of FIG. 6. FIG. 7B is an enlarged detail view of a portion of the heat sink ring, circuit board, LED and mask, of the light fixture or engine 71. In a fixture using one or more nanophosphors dispersed in a gas, the light transmissive structure takes the form of a gas filled container. Stated another way, container 76 with the gas 77 fills the volume 72 of the optical integrating cavity in the example of FIGS. 6 and 7. FIGS. 8-13 provide other views of the fixture or engine 71, whereas FIGS. 14-17 provide several different views of a heat sink ring. These and other drawings of this example are not drawn to scale. In several of the illustrations, such as FIGS. 6 and 13, for convenience, the lighting apparatus is shown in an orientation for emitting light downward. However, the apparatus 71 may be oriented in any desired direction to perform a desired general lighting application function.

The apparatus 71 could be used alone to form a light fixture or more likely would be used with other housing elements and possibly with a secondary optic (e.g. such as shown in FIG. 18) to form the overall commercial light fixture product. Together with other electrical components (e.g. as in FIG. 19), the apparatus or "light engine" 71 of FIG. 6 or the commercial fixture product of FIG. 18 would form a lighting system.

The exemplary fixture or engine 71 includes a plurality of LED type solid state light emitters 75 and a light transmissive structure 76 forming a volume 72 for an optical integrating cavity. In this example, the structure 76 also forms the container for the phosphor bearing gas 77. As shown in FIG. 7A, the structure or container 76 has a contoured outer surface 76c and an optical aperture surface 80. At least an outer peripheral portion 76p of the structure 76 along the contoured surface 76c is substantially rigid. The contoured surface 76c, at least in regions where there is no contact to a LED 75, has a roughened or etched texture.

As shown in FIG. 7A, the contoured outer surface 76c corresponds to a segment of a sphere somewhat less than a hemisphere and does not extend continuously to the periphery of the aperture surface 80 as in the earlier examples. In this example, the light transmissive structure 76 also has a peripheral optical coupling surface 76p between the contoured outer surface 76c and the optical aperture surface 80 that forms an obtuse angle with respect to the optical aperture surface 80 (and an acute angle with respect to the vertical in the downlight orientation of FIG. 6).

Although clear or transparent surfaces may be used, in this example, the contoured surface 76c has a roughened or etched texture, and some or all of the aperture surface 80 may have a roughened or etched texture. In such an implementation, at least any portion of the angled peripheral optical coupling surface 76p of the light transmissive structure 76 that receives light from one of the LEDs 75 likely would be highly transparent. Of course, the aperture surface 80 may be highly transparent as well. In the example, the aperture surface 80 is shown as a flat surface. However, those skilled in the art will recognize that this surface 80 may be convex or concave or have another non-flat contour.

In the example of FIGS. 6-13, the light output is circular, for a downlight or the like. In the circular output example, the outer surfaces of the container 76 approach or approximate a hemisphere that is somewhat truncated at the peripheral region by the angled surface 76p. The optical aperture surface here identified by number 80 approximates a circle. In optical cavity fixture examples, like that FIGS. 6-13, transmissive structures 76 having shapes corresponding to a portion or segment of a sphere or cylinder are preferred for ease of illustration and/or because curved surfaces provide better efficiencies than other shapes that include more edges and corners which tend to trap light. The round light, for example, uses a cavity based on a segment of a sphere, whereas an elongated light having a rectangular light output might use a cavity based more on a section of a cylinder. Those skilled in the art will understand, however, that the volume of the light transmissive structure forming the gas container 76, and thus the optical cavity 72 of the fixture or light engine 71, may have any shape providing adequate reflections within the volume/cavity for a particular application. For example, the contour of the upper surface 76c may be hemispherical, may correspond in cross section to a segment of a circle less than a half circle (less than hemispherical), or may extend somewhat further than a hemisphere to correspond in cross section to a segment of a circle larger than a half circle. Also, the contoured portion 76c may be somewhat flattened or somewhat elongated relative to the illustrated axis of the aperture 74, the aperture surface 80 and the exemplary container structure 76 (in the vertical direction in the exemplary downlight orientation depicted in FIG. 22). The coupling surface 76p is shown having a substantially flat cross-section, although of course it would curve around the circular structure 76. However, other shapes or contours for the surface 76p may be used, for example, with a convex cross section or concave cross-section or with indentations to receive emitting surfaces or elements of particular types of LEDs 75.

In the example of FIGS. 6 and 7A the light transmissive structure forming or filling the volume 72 also norms a container for a gas bearing one or more nanophosphors as shown at 77. Like the earlier examples, the gas might bear a single type of nanophosphor. However, we will assume that the light engine 71 is intended for a general lighting application and configured to produce high-CRI white light in one of the temperature ranges discussed earlier. Hence, the gas in the light transmissive container 71 has a plurality of nanophosphors dispersed therein, essentially as discussed above with regard to the examples of FIGS. 1A, 3, 4A and 4B.

The material forming the walls of the container 76 may exhibit high transmissivity and/or low absorption to light of the relevant wavelengths. The material, for example, may be a highly transmissive and/or low absorption acrylic having the desired shape. However, in this example, to provide a good oxygen barrier, the container 76 typically will be formed of a glass having suitable optical properties. For example, the light transmissive solid structure 76 may be formed of a fused silica type glass of at least a BK7 grade or equivalent optical quality. For optical efficiency, it is desirable for the solid structure 76, in this case the glass, to have a high transmissivity with respect to light of the relevant wavelengths processed within the optical cavity 72 and/or a low level of light absorption with respect to light of such wavelengths. For example, in an implementation using BK7 or better optical quality of glass, the highly transmissive glass exhibits 0.99 internal transmittance or better (BK7 exhibits a 0.992 internal transmittance).

The gas medium preferably exhibits high transmissivity and/or low absorption to light of the relevant wavelengths, although it may be transparent or somewhat translucent. Various gases may be suitable. As outlined above, exemplary gases include hydrogen gas, clear inert gases and clear hydrocarbon based gases; and two or more gases selected from this group may be combined to form the gaseous medium for bearing the nanophosphors as shown at 77 in FIGS. 6 and 7A.

The fixture or light engine 71 also includes a reflector 73. The reflector could be formed by white portions of the container structure or as a coating on the appropriate portion(s) of the interior surface(s) of the container structure. In the example, however, the reflector 73 is a separate external component having a diffusely reflective interior surface 73s extending over at least a substantial portion of the outer surface of the light transmissive container structure 76, in this case over the contoured outer surface 76c although it could extend over some portion or portions of the angled coupling surface 76p not expected to receive light input from the LEDs 75. The surface 76c is roughened for example by etching. For optical efficiency, however, the surface texture should provide only a minimal air gap between the diffusely reflective interior surface 73s of the reflector 73 and the corresponding portion(s) of the contoured outer surface 76c of the light transmissive structure 76. The diffuse reflective surface 73s forms an optical cavity from and/or encompassing the volume 72 of the light transmissive container structure 76 (including the nanophosphor bearing gas 77 filling the container). The optical integrating cavity has an optical aperture 74 formed from a portion or all of the aperture surface 80 of the light transmissive structure 76.

It is desirable that the diffusely reflective surface(s) 73s of the reflector 73 have a highly efficient reflective characteristic, e.g. a reflectivity equal to or greater than 90%, with respect to the relevant wavelengths. Diffuse white materials exhibiting 98% or greater reflectivity are available. Although other materials may be used, including some discussed above relative to earlier examples, the illustrated example of FIG. 6 uses WhiteOptics™. The WhiteOptics™ reflector 73 is approximately 97% reflective with respect to the visible white light from the LED type solid state emitters 75. In the example, the entire inner surface 73s of the reflector 73 is diffusely reflective, although those skilled in the art will appreciated that one or more substantial portions may be diffusely reflective while other portion(s) of the surface 73s may have different light reflective characteristics, such as a specular or semi-specular characteristic.

At least a portion of the aperture surface 80 of the light transmissive structure 76 serves as a transmissive optical passage or effective "optical aperture" 74 for emission of integrated light, from the optical integrating volume 72, in a direction to facilitate the particular general lighting application in the region or area to be illuminated by the light fixture (generally downward and/or outward from the fixture in the orientation of FIG. 6). The entire surface 80 of the solid container structure 76 could provide light emission. However, the example of FIGS. 6 and 7B includes a mask 79 having a reflective surface facing into the optical integrating volume 72, which somewhat reduces the surface area forming the transmissive passage to that portion of the surface shown at 74 in FIG. 6. The optical volume 72 operates as an optical integrating cavity (albeit one filled with the light transmissive solid of container structure 76), and the passage 74 for light emission forms the optical aperture of that cavity.

As noted, the surface of the mask 79 that faces into the optical integrating volume 72 (faces upward in the illustrated orientation) is reflective. That surface may be diffusely reflective, much like the surface 73s, or that mask surface may be specular, quasi specular or semi-specular. Other surfaces of the mask 79 may or may not be reflective, and if reflective, may exhibit the same or different types/qualities of reflectivity than the surface of the mask 79 that faces into the optical integrating volume 72. In one configuration, the surface of the mask 79 that faces into the optical integrating volume 72 might be diffusely reflective (having reflective properties similar to those of reflective surface 73s), whereas the surface of the mask facing inward/across the aperture 74 might be specular. Specular reflectivity across the aperture 74 reduces reflection back through the aperture into the integrating volume due to diffuse reflection that might otherwise occur if that portion of the mask exhibited a diffuse reflectivity.

In the example, the light engine 71 also includes one or more solid state light emitters 75. An emitter 75 may be any appropriate type of light emitting semiconductor based device, as shown in FIGS. 6 and 7B. In the specific examples discussed herein the solid state light emitters are light emitting diodes (LEDs).

Since the light engine 71 uses the same or similar nanophosphors as in several of the specific examples discussed above, the absorption spectra of the exemplary doped semiconductor nanophosphors in the gas at 77 exhibit upper limits at approximately 460 nm or below (less than or equal to approximately 460 nm). In examples using one or more of these types of nanophosphors, the solid state source comprises LEDs 75 rated for producing electromagnetic energy of a wavelength in the range of 460 nm and below (≦460 nm). For example, the LED may be rated for producing near UV electromagnetic energy, such as a rated wavelength in the range of 380-420 nm. For further discussion of this example, we will assume that the LEDs 75 are rated as 405 nm emission devices. Hence, in the illustrated example of the circuitry (FIG. 19 as discussed, later), each LED is a 405 nm LED of the same or similar model. As noted, there may be as few as one solid state emitter, however, for illustration and discussion purposes, we will assume in most instances below that the fixture or light engine 71 includes a plurality of 405 nm LEDs. The number and output capabilities of the LEDs 75 are such that the combined white light output produced by 405 nm pumping of the nanophosphors in the gas 77 emerging via the aperture 74 provides light intensity sufficient for a particular general lighting application intended for the light fixture 71. An actual downlight implementation, for example, might include fifteen 405 nm LEDs as the solid state emitters 75.

As discussed more below, the LEDs 75 are held against the angled peripheral optical coupling surface 76p of the light transmissive container structure 76, to supply light through that surface into the interior volume 72 formed by the structure 76. There may be some minimal air gap between the emitter output and the optical coupling surface 76p. However, to improve out-coupling of light from the LEDs 75 into the light transmissive container structure 76, it may be helpful to provide an optical grease, glue or gel between the peripheral optical coupling surface 76p and the output of each LED 75. This material eliminates any air gap and provides refractive index matching relative to the material of the relevant portion of the light transmissive structure 76, for example, the material forming the angled peripheral optical coupling surface 76p.

The exemplary light fixture or engine 71 also includes a flexible circuit board 81. The flexible circuit board 81 has a mounting section or region 81p that typically will be at least substantially planar (and is therefore referred to herein as a "planar" mounting section) for convenience in this example. The planar mounting section 81p of the flexible circuit board 81 has an inner peripheral portion. In this example, the lateral shape of the container forming the light transmissive structure 76 is circular (see e.g. top view in FIG. 9). The inner peripheral portion of the flexible circuit board 81 has a substantially similar shape, that is to say a circular shape in the example. The circular inner peripheral portion of the flexible circuit board 81 has a size slightly larger than the circular outer peripheral portion at the edge between the surfaces 76c and 76p of the light transmissive structure 76. The flexible circuit board includes a strip 81e, extending away from the planar mounting section, for providing electrical connection(s) to the driver circuitry (e.g. as in FIG. 19).

The flexible circuit board 81 also has flexible tabs 81t attached to and extending from the inner peripheral region of the flexible circuit board 81. As noted earlier, the number and type of LED type solid state light emitters 75 used in the fixture 71 are selected so as to produce light intensity sufficient for a general lighting application of the fixture 71. The LEDs 75 are mounted on the tabs 81t. At least one of the LEDs 75 is mounted on a first surface of each of the tabs 81t of the flexible circuit board 81, in this example, although some tabs could be empty or carry other elements such as a light sensor instead of a LED.

The fixture 71 also includes a heat sink member 83. The heat sink member 83 is constructed of a material with good heat conduction properties and sufficient strength to support the flexible circuit board and associated LED light emitters, typically a metal such as aluminum. As shown in a later drawing (FIG. 18), cooling fins may be coupled to the heat sink member 83, for example, as part of one or more additional aluminum housing components. More detailed views of the heat sink member or ring 83 are shown in FIGS. 14-17.

The heat sink member 83 has an inner peripheral portion of substantially similar shape and of a size slightly larger than the outer peripheral portion of the light transmissive container 76. In this case, the heat sink member 83 has a circular inner peripheral portion but with a surface 91 (FIGS. 30 and 32) at a slant corresponding to the angle of surface 76p. The obtuse angle of the peripheral optical coupling surface 76p with respect to the optical aperture surface 80 of light transmissive structure is approximately 120° (interior angle with respect to the horizontal in the illustrated orientation is 60°, and angle of the surface cross section relative to the vertical in the illustrated orientation is 30°). Hence, although the inner peripheral portion of the heat sink member 83 has a somewhat larger diameter than the outer peripheral portion of the light transmissive container structure 76, the inner surface (91 in FIG. 30) of the heat sink member 83 is machined to have an angle of approximately 120° with respect to the optical aperture surface 80 (interior angle with respect to the horizontal in the illustrated orientation of FIG. 6 is 60°, and angle of the surface cross section relative to the vertical in the illustrated orientation of FIG. 6 is 30°).

The ring shaped heat sink member 83 in the example is a single solid member, for example, formed of aluminum. Those skilled in the art will realize that other configurations may be used. The opposite side of heat sink member 83 (FIG. 17) may have a ring-shaped indentation 93 for mating with the mask 79 (FIGS. 6 and 7B). The exemplary heat sink ring 83 also includes one or more posts 92 (FIGS. 14-17) extending outward from the main part of the ring. Each post 92 has a screw or bolt hole for passage of a bolt or similar fastener, for use in the assembly of the light engine 71 together with other components.

Returning to FIGS. 6 and 7B, as assembled to form the light fixture or engine 71, the planar mounting section 81p of the flexible circuit board 81 is mounted on an attachment surface of the heat sink member 83 having an inner edge corresponding to the junction between angled inner surface and the mounting surface. In the illustrated downlight orientation (FIG. 6), the attachment surface of the heat sink member 83 is on the top side of the heat sink member. The planar mounting section 81p of the flexible circuit board 81 may be attached to the planar attachment surface of the heat sink member 83 by an adhesive or glue or by any other cost-effective means.

The flexible tabs 81t are bent at a substantial angle with respect to the mounting section of the heat sink member 83, around the inner edge of that surface, by pressure of the LEDs 75 mounted on the tabs 81t against the outer peripheral coupling surface 76p of the light transmissive structure 76. In the illustrated downlight orientation (FIG. 6), each tab will bend to an angle approximately the same as the angle of the surfaces that it fits between, in this case approximately 120° with respect to the optical aperture surface 80 (interior angle with respect to the horizontal in the illustrated orientation of FIG. 6 is 60°, and angle of the surface cross section relative to the vertical in the illustrated orientation of FIG. 6 is 30°).

The tabs may be constructed in one of a number of ways so as to allow heat transfer from the LED 75 to the heat sink member 83, in this case through a thermal interface material (TIM) 82 positioned between the second surface of each tab 81t and a corresponding inner surface of the heat sink member 83. The first surface of a tab 81t supports a near UV LED 75 and receives heat from the emitter. The tab 81t could be constructed with heat conductive surface pads and metal-filled vias through the tab to conduct the heat from the near UV LED 75 to the opposite or second surface of the tab 81t.

The second surface of each respective one of the tabs provides heat transfer to the heat sink member 83, in this case through the TIM 82, to permit heat transfer from each solid state emitter LED 75 on each respective tab to the heat sink member 83. Alternatively, as shown in the enlarged cross sectional detail of FIG. 7B, the TIM might extend through a via through the tab to contact the LED 75 directly. In this case, the extension of the TIM 82 would initially receive heat from the LED 75 and would carry the heat to the heat sink member 83.

In the example, the fixture or light engine 71 includes the TIM 82. The TIM 82 provides electrical insulation between the tabs 81t and the heat sink member 83, for example, for an implementation in which the heat slug of the LED 75 is conductive. The TIM 82, however, also provides thermal conductivity to the heat sink member 83. In the examples, pressure created by contact of the LEDs 75 with the angled optical coupling surface 76p along the outer peripheral portion of the light transmissive structure 76 compresses the TIM 82 against the surface of the heat sink member 83. In examples that utilize other types of LEDs, where the heat slug of the LED 75 is non-conductive, the TIM may not be needed. However, in such cases, the tab 81t would be configured to provide heat transfer from the LED 75 to the heat sink ring 83.

The positioning of each LED 75 provides an orientation in which a central axis of emission of the respective light emitter (shown as an arrow from each LED 75 in FIG. 6) is at a substantial angle with respect to the perpendicular axis of the aperture 74 and/or of the aperture surface 80 of the light transmissive structure 76. The angle of emission with respect to the aperture axis might be approximately perpendicular (90°). In this example (FIG. 6), however, the coupling surface 76p is at an angle so that the central axis of emission of the respective LED 75 is directed somewhat more away from aperture 74 and/or the aperture surface 80 of the light transmissive structure 76. Since, the central axis of emission of the respective LED 75 is substantially perpendicular to the coupling surface 76p, and the coupling surface 76p forms an obtuse angle with respect to the aperture surface 80, the central axis of emission of the respective LED 75 in this example is at an acute angle away from the aperture surface 80.

Although other angles may be used, the coupling surface 76p in the example forms an angle of approximately 120° with respect to the aperture surface 80, therefore the angle between the central axis of emission of the respective LED 75 and the aperture surface 80 in this example is approximately 30°. From another perspective, this results in the central axis of emission of the respective LED 75 having approximately a 60° angle with respect to the perpendicular axis of the aperture 74 and/or of the aperture surface 80 of the light transmissive container structure 76.

This angle of emission from the LEDs 75 reduces the amount of the direct emissions that impact the optical aperture surface 80 at a steep angle (as compared to a 90° emission angle relative to the axis, for example). At least in the region 74 forming the actual aperture, those direct light emissions that do impact the surface 80 impact at a relatively shallow angle. The portion 74 of the aperture surface 80 of the light transmissive container 76 that serves as the optical aperture or passage out of the optical integrating volume 72 exhibits total internal reflection with respect to light reaching that surface directly from the LEDs 75, and that total internal reflection reflects direct light emission hitting the surface at a shallow angle back into the optical integrating volume 72. In contrast, light that has been diffusely reflected from regions of the surface 73s of the reflector arriving at larger angles to the surface 80 are not subject to total internal reflection and pass through portion 74 of the aperture surface 80 that forms the optical aperture.

The mask 79 therefore can be relatively small in that it only needs to extend far enough out covering the aperture surface 80 of the light transmissive container structure 76 so as to block direct view of the LEDs 75 through the aperture 74 and to reflect those few direct emissions of the LEDs 75 that might otherwise still impact the surface 80 at too high or large an angle for total internal reflection. In this way, the combination of total internal reflection in the portion 74 of the surface 80 of the container 76 together with the reflective mask 79 reflects all or at least substantially all of the direct emissions from the LEDs 75, that otherwise would miss the reflector surface 73s, back into the optical integrating volume 72. Stated another way, a person in the area or region illuminated by the fixture 71 would not perceive the LEDs at 75 as visible individual light sources. Instead, virtually all light input to the volume 72 from the LED type emitters 75 will excite a nanophosphor in the gas 77 or will diffusely reflect one or more times from the surface 73s for passage back through the container 77 and gas 76 before emergence through the aperture portion 74 of the surface 80 of the container 76. Some light from excited nanophosphors will emerge directly from the volume through the optical aperture 74, but much of the light from excited nanophosphors also will diffusely reflect one or more times from the surface 73s for passage back through the container 77 and the gas 76 before emergence through the aperture portion 74 of the surface 80 of the container 76. However, the visible light from phosphor excitation will pass through the gas without further absorption by the nanophosphors because the emission spectra are separated or shifted from the absorption spectra. Since the surface 73s provides diffuse reflectivity, the volume 72 acts as an optical integrating cavity so that the portion 74 of the surface 80 forms an optical aperture providing a substantially uniform output distribution of integrated light (e.g. substantially Lambertian), mainly from the phosphor emissions by the doped semiconductor nanophosphors.

It is possible to utilize the total internal reflection to reduce the size of the mask 79 or otherwise enlarge the effective aperture (size of the optical passage) at 74 through which light emerges from the integrating volume 72. Due to the larger optical aperture or passage, the fixture 71 can actually emit more light with fewer average reflections within the integrating volume 72, improving efficiency of the fixture in comparison to prior fixtures that utilized cavities and apertures that were open to air.

In the example of FIG. 6, the LEDs emit 405 nm near UV energy mostly toward the inner surface 73s of the reflector 73. 405 nm light emitted from a LED 75 in other directions is reflected by the inner surface of the mask 79 or total internal reflection at the optical aperture portion 74 of the surface 80 towards the inner reflective surface 73s of the reflector 73. As the 405 nm light from the LEDs 75 and reflected from the mask 79 and the aperture portion 74 of the surface 80 passes through the light transmissive wall(s) of the container 76, where it excites the doped semiconductor nanophosphors in the gas at 77. Any 405 nm light that has not yet excited a phosphor reflects from the diffusely reflective surface 73s of the reflector 73 back through the container 76 and may excite the doped semiconductor nanophosphors in the gas at 77 on the second or subsequent pass.

Light produced by the phosphor excitations, is emitted in all directions within the cavity 72. Much of that light is also reflected one or more times from the inner surface 73s of reflector 73, the inner surface of the mask 179 and some total internal reflection at the surface 80. At least some of those reflections, particularly those off the inner surface 73s of reflector 73, are diffuse reflections. In this way, the cavity 72 integrates the light produced by the various phosphor emissions into a highly integrated light for output via the optical aperture 74 (when reaching the surface at a steep enough angle to overcome the total internal reflection).

This optical integration by diffuse reflection within the cavity 72 integrates the light produced by the nanophosphor excitation to form integrated light of the desired characteristics at the optical aperture 74 providing a substantially uniform output distribution of integrated light (e.g. substantially Lambertian) across the area of the aperture 74. As in the earlier examples, the particular doped semiconductor nanophosphors in the fixture 71 result in a light output that is at least substantially white and has a color rendering index (CRI) of 75 or higher. The white light output of the solid state light fixture 71 through optical aperture 74 exhibits color temperature in one of the specified ranges along the black body curve. The doped semiconductor nanophosphors may be selected and mixed to stack the emissions spectra thereof so that the white light output through optical aperture 74 exhibits color temperature of 2,725±145° Kelvin. Alternatively, the doped semiconductor nanophosphors may be selected and mixed to stack the emissions spectra thereof so that the white light output through optical aperture 174 exhibits color temperature of 3,045±175° Kelvin. As yet another alternative, the doped semiconductor nanophosphors may be selected and mixed to stack the emissions spectra thereof so that the white light output through optical aperture 74 exhibits color temperature of 3,465±245° Kelvin. As a further alternative, the doped semiconductor nanophosphors may be selected and mixed to stack the emissions spectra thereof so that the white light output through optical aperture 74 exhibits color temperature of and 3,985±275° Kelvin.

The effective optical aperture at 74 forms a virtual source of the light from lighting apparatus or fixture 71, which exhibits a relatively Lambertian distribution across the virtual source, as in the earlier examples. When the fixture illumination is viewed from the area illuminated by the combined light, the virtual source at 74 appears to have substantially infinite depth of the integrated light. Also, the visible intensity is spread uniformly across the virtual source, as opposed to one or more individual small point sources of higher intensity as would be seen if the one or more solid state sources were directly observable without sufficient diffuse processing before emission through an aperture. The optical integration in the volume 72 reduces or eliminates pixelation and striation in the light output via the aperture 74. The light output exhibits a relatively low maximum-to-minimum intensity ratio across that region 74. In virtual source examples discussed herein, like that of FIGS. 6-17, the virtual source light output via optical aperture 74 exhibits a maximum to minimum ratio of 2 to 1 or less over substantially the entire optical output area. The area of the virtual source is at least one order of magnitude larger than the area of the point source output(s) of the individual LEDs 75. In this way, the diffuse optical processing may convert a single small area (point) sources of light from even a single LED to a broader area virtual source of white light at the virtual source output region. The diffuse optical processing can also combine a number of such point source outputs from any number of LEDs 75 to form one virtual source at the virtual source, at the region of optical aperture 74 in the example of FIGS. 6-17.

The optical aperture 74 at the surface 80 of the solid type light transmissive container structure 76 may serve as the light output if the fixture 71, directing optically integrated light of relatively uniform intensity distribution to a desired area or region to be illuminated in accord with a particular general lighting application of the fixture. In such an arrangement, the fixture may include a trim ring or the like (not shown) covering some or all of the exposed components (but not the optical aperture 74). Although not shown in this example, there could be a lens, filter or diffuser (e.g. a holographic element) to help distribute the output light at the aperture 74.

However, the light engine example 71 of FIG. 6 is intended for use with other elements to form a commercial fixture. As shown in cross-section in FIG. 18, the commercial fixture product 90 includes the elements of the light engine, including the reflector 73, the LED type emitters 75, the light transmissive container structure 76 (with aperture surface 80), the mask 79, the heat sink ring 81, etc. The fixture 90 also includes an upper housing or cover 94 and a lower housing 96. The upper housing 94 encloses the reflector 73 and the solid light transmissive structure 76 although it is somewhat larger than the reflector 73 and the solid light transmissive structure 76 so that there is some space between the reflector and the inner curved surface of the upper housing 94.

The fixture 90 also includes a flexible compressible pad 95, between the inner surface of the upper housing 94 and the outer surface of the reflector 73. Although other attachment mechanisms may be used, in this example, the upper housing 94 is bolted to a lower hosing 96. The bolts extend through holes in posts 92 formed in the heat sink ring 81 (see e.g. FIGS. 14-17). In this way, the heat sink ring 81 is sandwiched between opposed surfaces of the housing members 94, 96 (FIG. 18). The inner surface of the upper housing 94 and the pad 95 are sized so that the assembly of the housings and the heat sink ring compresses the pad 95 between the inner surface of the upper housing 94 and the outer surface of the reflector 73. This applies pressure through the reflector 73 to the solid light transmissive structure 76, to hold the structure 76 as well as the LEDs 75, the tabs of the flexible circuit board and the TIM against the angled surface of the heat sink ring 83, as shown for example in FIGS. 6, 11 and 18. The aperture surface 80 also abuts the white reflective surface of the mask 79. The use of the angled shapes also tends to align the various components of the light engine (71 in FIG. 6) in the desired manner, for example, without tilt of the structure 76 or surface 80 relative to the mask 79.

The housing elements 94, 96, like the heat sink ring 83, are formed of a good heat conductive material. In the example, the housings 94, 96 may be cast aluminum elements. Outer portions of one or preferably both housings 94, 96 incorporate fins. Heat from the LEDs 75 is transferred to the heat sink ring 83, as discussed earlier. From the ring 83, the heat travels to the housings 94, 96 where it may be dissipated to the surrounding atmosphere via the fins. To promote heat transfer from the heat sink member or ring 83 to the housings, the fixture may include adhesive TIM layers on the appropriate surfaces of the heat sink ring 83 (see FIGS. 6 and 7B).

The fixture 90 illustrated in FIG. 18 also includes a secondary optic. Although other secondary optics may be used, in this example the secondary optic includes a deflector or concentrator 97 having a reflective inner surface. The inner surface of the deflector or concentrator 97 may have different reflective characteristics. For example specular, semi-specular and diffuse reflectivities and/or combinations thereof are contemplated. As noted above, the surface of the mask 79 that faces into the optical integrating volume 72 (faces upward in the orientation illustrated in FIGS. 6 and 18) may be diffusely reflective. The mask includes a boss formed to extend away from the aperture surface 80. The inner surface of this boss or extension faces across the aperture opening through the mask 79 and might be considered the start of the secondary optic formed by or together with the deflector 97. The inner surface of the boss or extension and the inner surface of the deflector 97 may have similar specular reflective properties, e.g. both may be specular or quasi-specular. As shown in FIG. 18, the fixture 90 may also include a trim ring 98 to facilitate a desired appearance when the fixture for example is mounted in a ceiling.

Again, in a fixture having a multi-nanophosphor dispersion in the gas 77, the light produced by excitation of the semiconductor nanophosphor and as integrated in and output from the cavity 72 would be at least substantially white and would have a CRI of 75 or better. The resulting light produced by the semiconductor nanophosphors and emitted from the cavity also would exhibit color temperature in one of the following four specific ranges along the black body curve: 2,725±145° Kelvin; 3,045±175° Kelvin; 3,465±245° Kelvin; and 3,985±275° Kelvin.

As in the earlier examples, the near 405 nm LEDs 75 in the example of FIGS. 6-18 may be driven by any known or available circuitry that is sufficient to provide adequate power to drive the emitters at the level or levels appropriate to the particular lighting application of each particular fixture. Analog and digital circuits for controlling operations and driving the emitters are contemplated. Those skilled in the art should be familiar with various suitable circuits.

For many white light applications, the control circuitry may offer relatively simple user control, e.g. just ON/OFF or possibly with some rudimentary dimmer functionality. For example, in a general lighting application, a triac dimmable driver may be used to provide DC drive current from an AC power source. Such a driver offers ON/OFF control as well as level setting control responsive to triac variations of the AC waveform from a standard type dimmer unit.

Figure 19:
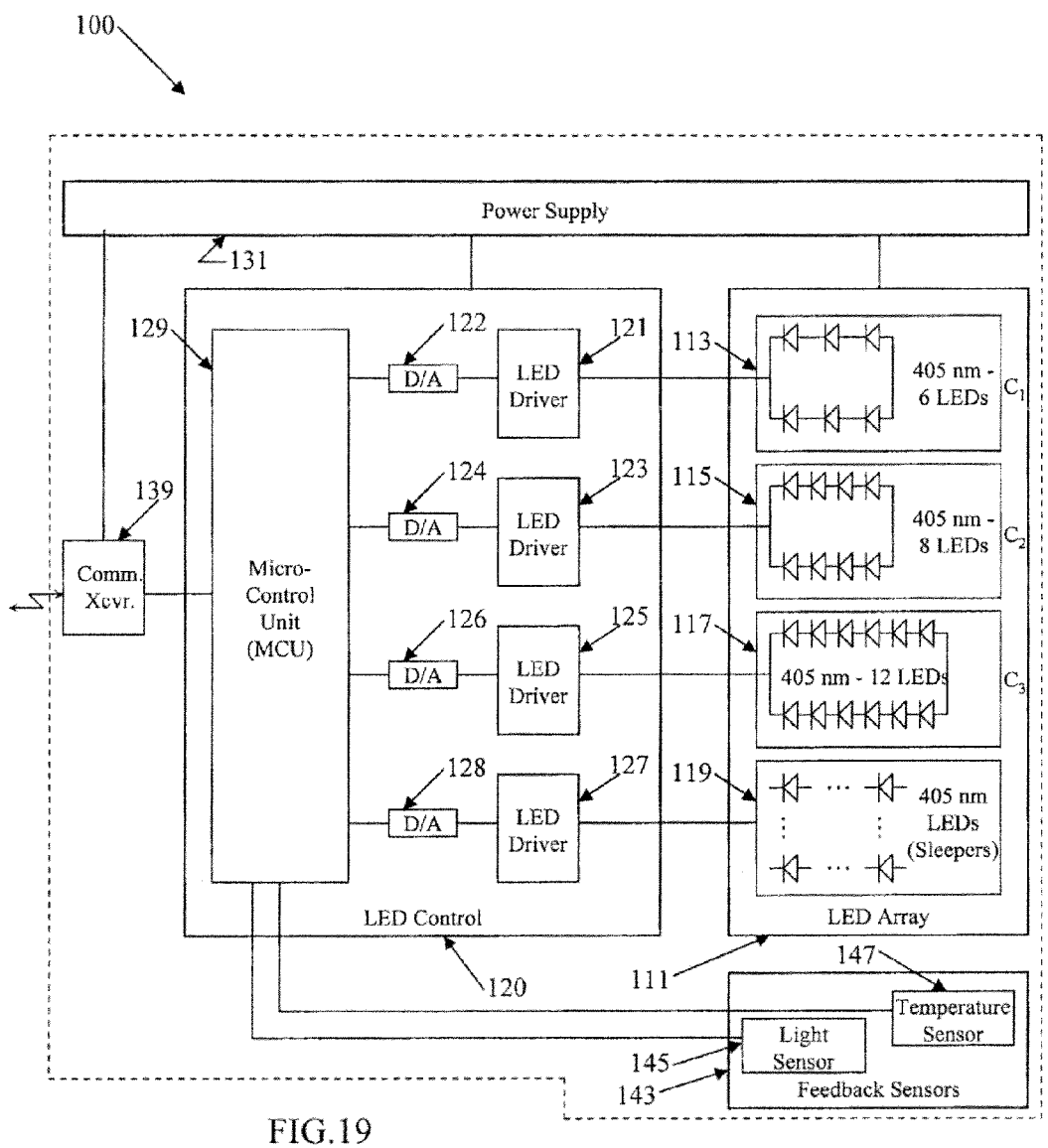
FIG. 19 is a functional block type circuit diagram, of an implementation of the system control circuit and LED array which may also offer dimming control.

However, for completeness, we will discuss an example of suitable circuitry, offering relatively sophisticated control capabilities, with reference to FIG. 19. That drawing figure is a block diagram of an exemplary solid state lighting system 100, including the control circuitry and the LED type solid state light sources, for a white light application, such as an implementation of the fixture of FIGS. 6-18 with 405 nm LEDs. The LEDs and possibly some of the other electronic elements of the system, however, could be incorporated into a fixture in any of the examples discussed above, with the LEDs shown in FIG. 19 serving as the various solid state sources in any of the exemplary fixtures. The circuitry of FIG. 19 provides digital programmable control of the light.

In the lighting system 100 of FIG. 19, the set of solid state sources takes the form of a LED array 111. In the fixture of FIGS. 6-18, the LEDs of the array 111 would correspond to the LEDs 75 mounted on the tabs 81t of the flexible circuit board 81. A circuit similar to that of FIG. 19 has been used in the past, for example, for RGB type lighting (see e.g. U.S. Pat. No. 6,995,355). The same circuit is being used here with LEDs of a single wavelength rating λ of emission chosen to fall within the absorption spectra of the selected nanophosphors dispersed in the gas at 77. Although the circuit elements are similar to those of the earlier RGB system, the system 100 here uses different programming, to provide step-wise intensity control in a white lighting system having a substantial number of LEDs.

As noted, for discussion purposes, the array 111 in the example comprises one or more 405 nm LEDs. The LEDs in the array 111 are arranged in each of four different strings forming lighting channels C1 to C4. Here, the array 111 includes three initially active strings of LEDs, represented by LED blocks 113, 115 and 117. The strings may have the same number of one or more LEDs, or the strings may have various combinations of different numbers of one or more LEDs. For purposes of discussion, we will assume that the first block or string of LEDs 113 comprises 6 LEDs. The LEDs may be connected in series, but in the example, two sets of 3 series connected LEDs are connected in parallel to form the block or string of 6 405 nm near UV LEDs 113. The LEDs may be considered as a first channel C1, for control purposes discussed more later.

In a similar fashion, the second block or string of LEDs 115 comprises 8 405 nm LEDs. The 8 LEDs may be connected in series, but in the example, two sets of 4 series connected LEDs are connected in parallel to form the block or string of 8 405 nm near UV LEDs 115. The third block or string of LEDs 117 comprises 12 LEDs. The 12 LEDs may be connected in series, but in the example, two sets of 6 series connected LEDs are connected in parallel to form the block or string of 12 405 nm near UV LEDs 117. The LEDs 115 may be considered as a second channel C, whereas the LEDs 117 may be considered as a third channel C3 for control purposes discussed more later.

The LED array 111 in this example also includes a number of additional or 'other' LEDs 119. Some implementations may include various color LEDs, such as specific primary color LEDs, IR LEDs or UV LEDs, for various ancillary purposes. Another approach might use the LEDs 119 for a fourth channel of 405 nm LEDs to further control intensity in a step-wise manner. In the example, however, the additional LEDs 119 are 'sleepers.' Initially, the LEDs 113-117 would be generally active and operate in the normal range of intensity settings, whereas sleepers 119 initially would be inactive. Inactive LEDs are activated when needed, typically in response to feedback indicating a need for increased output (e.g. due to decreased performance of some or all of the originally active LEDs 113-117). The set of sleepers 119 may include any particular number and/or arrangement of the LEDs as deemed appropriate for a particular application.

Each string may be considered a solid state light emitting element or 'source' coupled to supply near UV or short wavelength visible light energy to the cavity or other fixture optic so as to pump or excite the semiconductor nanophosphor, where each such element or string comprises one or more light emitting diodes (LEDs) serving as individual solid state emitters. In the example of FIG. 19, each such element or string 113 to 119 comprises a plurality of the 405 nm LEDs.

The electrical components shown in FIG. 19 also include a LED control system 120. The control system 121 includes LED driver circuits for the various LEDs of the array 111 as well as a micro-control unit (MCU) 129. In the example, the MCU 129 controls the LED driver circuits via digital-to-analog (D/A) converters. The driver circuit 121 drives the LEDs 113 of the first channel C1, the driver circuit 123 drives the LEDs 115 of the second channel C2, and the driver circuit 125 drives the LEDs 117 of the third channel C3. In a similar fashion, when active, the driver circuit 127 provides electrical current to the other LEDs 119.

Although current modulation (e.g. pulse width modulation) or current amplitude control could be used, this example uses constant current to the LEDs. Hence, the intensity of the emitted light of a given LED in the array 111 is proportional to the level of current supplied by the respective driver circuit. The current output of each driver circuit is controlled by the higher level logic of the system, in this case, by the programmable MCU 129 via the respective A/D converter.

The driver circuits supply electrical current at the respective levels for the individual sets of 405 nm LEDs 113-119 to cause the LEDs to emit light. The MCU 129 controls the LED driver circuit 121 via a D/A converter 122, and the MCU 129 controls the LED driver circuit 123 via a D/A converter 124. Similarly, the MCU 129 controls the LED driver circuit 125 via a D/A converter 126. The amount of the emitted light of a given LED set is related to the level of current supplied by the respective driver circuit.

In a similar fashion, the MCU 129 controls the LED driver circuit 127 via the D/A converter 128. When active, the driver circuit 127 provides electrical current to the sleeper LEDs 119.

The LED driver circuits and the microcontroller 129 receive power from a power supply 131, which is connected to an appropriate power source (not separately shown). For most general lighting applications, the power source will be an AC line current source, however, some applications may utilize DC power from a battery or the like. The power supply 131 provides AC to DC conversion if necessary, and converts the voltage and current from the source to the levels needed by the LED driver circuits and the MCU 129.

A programmable microcontroller or microprocessor, such as the MCU 129, typically includes or has coupled thereto random-access memory (RAM) for storing data and read-only memory (ROM) and/or electrically erasable read only memory (EEROM) for storing control programming and any pre-defined operational parameters, such as pre-established light data for the current setting(s) for the strings of LEDs 113 to 119. The microcontroller 129 itself comprises registers and other components for implementing a central processing unit (CPU) and possibly an associated arithmetic logic unit. The CPU implements the program to process data in the desired manner and thereby generates desired control outputs. The microcontroller 129 is programmed to control the LED driver circuits 121 to 127 via the A/D converters 122 to 128 to set the individual output intensities of the 405 nm LEDs to desired levels, and in this circuit example to implement a step-wise system intensity control by selectively activating and deactivating strings of LEDs. For an ON-state of a string/channel, the program of the microcontroller 129 will set the level of the current to the desired level at or around the rated current, by providing an appropriate data input to the D/A converter for the respective channel.

The electrical system associated with the fixture also includes a digital data communication interface 139 that enables communications to and/or from a separate or remote transceiver (not shown in this drawing) which provides communications for an appropriate control element, e.g. for implementing a desired user interface. A number of fixtures of the type shown may connect over a common communication link, so that one control transceiver can provide instructions via interfaces 139 to the MCUs 129 in a number of such fixtures. The transceiver at the other end of the link (opposite the interface 139) provides communications to the fixture(s) in accord with the appropriate protocol. Different forms of communication may be used to offer different links to the user interface device. Some versions, for example, may implement an RF link to a personal digital assistant by which the user could select intensity or brightness settings. Various rotary switches and wired controls may be used, and other designs may implement various wired or wireless network communications. Any desired medium and/or communications protocol may be utilized, and the data communication interface 139 may receive digital intensity setting inputs and/or other control related information from any type of user interface or master control unit.

To insure that the desired performance is maintained, the MCU 129 in this implementation receives a feedback signal from one or more sensors 143. A variety of different sensors may be used, alone or in combination, for different applications. In the example, the sensors 143 include a light intensity sensor 145 and a temperature sensor 147. The MCU 129 may use the sensed temperature feedback in a variety of ways, e.g. to adjust operating parameters if an excessive temperature is detected.

The light sensor 145 provides intensity information to the MCU 129. A variety of different sensors are available, for use as the sensor 145. In a cavity optic such as in the fixture in the system 50 of FIG. 6A, the light sensor 145 might be coupled to detect intensity of the integrated light either emitted through the aperture or as integrated within the optical cavity. For example, the sensor 145 may be mounted alongside the LEDs for directly receiving light processed within the optic. The MCU 129 uses the intensity feedback information to determine when to activate the sleeper LEDs 119. The intensity feedback information may also cause the MCU 129 to adjust the constant current levels applied to one or more of the strings 113 to 117 of 405 nm LEDs in the control channels C1 to C3, to provide some degree of compensation for declining performance before it becomes necessary to activate the sleepers.

Alternatively, if the sensor 145 sensed ambient light outside the fixture, the control might activate or adjust the intensity of light output in response to the ambient light. For example, in a setting with considerable natural light access, the MCU programming might cause the MCU 129 to reduce or cut-off the light output of the fixture when daylight is bright, to reduce energy consumption on bright sunny days. However, the MCU programming would then provide somewhat higher intensity in the presence of some lower intensity natural light. e.g. in the early morning or in late afternoon or on cloudy days, and allow full intensity output from the fixture when there was no other substantial ambient light, e.g. at night.

Control of the near LED outputs could be controlled by selective modulation of the drive signals applied to the various LEDs. For example, the programming of the MCU 129 could cause the MCU to activate the A/D converters and thus the LED drivers to implement pulse width or pulse amplitude modulation to establish desired output levels for the LEDs of the respective control channels C1 to C3. Alternatively, the programming of the MCU 129 could cause the MCU to activate the A/D converters and thus the LED drivers to adjust otherwise constant current levels of the LEDs of the respective control channels C1 to C3. However, in the example, the MCU 129 simply controls the light output levels by activating the A/D converters to establish and maintain desired magnitudes for the current supplied by the respective driver circuit and thus the proportional intensity of the emitted light from each given string of LEDs. For an ON-state of a string/channel, the program of the MCU 129 will cause the MCU to set the level of the current to the desired level at or around the rated current, by providing an appropriate data input to the D/A converter for the particular channel. The LED light output is proportional to the current from the respective driver, as set through the D/A converter. The D/A converter will continue to output the particular analog level, to set the current and thus the LED output intensity in accord with the last command from the MCU 129, until the MCU 129 issues a new command to the particular D/A converter. While ON, the current will remain relatively constant. The LEDs of the string thus output near UV light of a corresponding relatively constant intensity. Since there is no modulation, it is expected that there will be little or no change for relatively long periods of ON-time, e.g. until the temperature or intensity feedback indicates a need for adjustment.

The current for the different channels C1 to C3 and/or the sleeper LEDs 119 may be different, e.g. if different numbers and/or types of LEDs are used, but where the LEDs in the array 111 are all of the same type, the current for the different channels C1 to C3 and/or the sleeper LEDs 119 in the ON state would all be approximately the same magnitude. For the OFF state of a particular string of LEDs 113 to 119, the MCU provides a 0 data input to the D/A converter for the respective string of LEDs.

Setting of the ON-OFF states of the LED strings 113-117 provides for selective control of the overall number of near UV LEDs of the array 111 that are ON in any given state. In the three main channel example (119 being for a sleeper channel), it is possible to control the states of the LED strings 113-117 to provide eight different brightness steps from 0 to 7, that is to say from all OFF (0 LEDs ON) to all 26 of the LEDs ON.

For the step-wise intensity control, the MCU 129 will control each driver via its associated A/D converter so as to supply constant current to the respective string of LEDs, at or around the rated current of the particular set of LEDs. Based on feedback, the MCU may adjust the level of the constant current somewhat, e.g. to compensate for some degree of degradation over time before it becomes necessary to activate the sleeper LEDs 119. In any case, the current level will remain within a range of the rated current for the particular string/channel of LEDs so that those LEDs produce the rated light out, for interaction with the semiconductor nanophosphor in the fixture optic, for example, to generate the white light of the high CRI and desired color temperature in a multi-phosphor white light implementation, as discussed above.

In the example, there are 8 possible system states or intensities, which range from 0 for full OFF up to 7 for maximum ON. To select among the states, the communication interface 139 would receive a data signal from an input device, e.g. a user interface or a higher level automatic control, and would supply at least 3-bits of intensity control data to the MCU 129.

In the 0 state, all of the control channels C1 to C3 are OFF, and thus there are no LEDs ON. Conversely, in the 7 state, all of the control channels C1 to C3 are ON, and thus all 26 of the near UV LEDs 113-117 are ON and producing 405 nm light for excitation of the semiconductor nanophosphor in the optic. The other states provide a series of steps between full OFF and full ON. For example, at the brightness level number 1, only the first control channel C1 is ON, and the other channels C2 and C3 are OFF. In that state, only the 6 LEDs of the first control channel C1 are ON. At the brightness level number 2, only the second control channel C2 is ON, and the other channels C1 and C3 are OFF. In that state, only the 8 LEDs of the second control channel C2 are ON. Similarly, at the brightness level number 3, only the third control channel C3 is ON, and the other channels C1 and C2 are OFF. In that state, only the 12 LEDs of the third control channel C3 are ON. In the next three states (brightness levels 4-6) different combinations of two channels are ON concurrently. For example, at the brightness level number 4, the first control channel C1 and the second control channel C2 are both ON, but the other channel C3 is OFF. In that state, the 14 LEDs of the channels C1 and C2 are ON. At the brightness level number 5, the first control channel C1 and the third control channel C3 are both ON, but the other channel C2 is OFF. In that state, the 18 LEDs of the channels C1 and C3 are ON. Similarly, at the brightness level number 6, the second control channel C2 and the third control channel C3 are both ON, but the other channel C1 is OFF. In that state, the 20 LEDs of the channels C2 and C3 are ON.

The system can step up or down through the levels, in response to appropriate control inputs, e.g. received from a user interface element. Assuming that all of the LEDs generate approximately the same near UV light output at the rated current setting, the system intensity will be proportional to the number of near UV LEDs ON at each level. Hence, in the example of FIG. 19, the possible brightness steps will correspond to the levels of intensity at which 0, 6, 8, 12, 14, 18, 20, and 26 of the near UV LEDs are ON, respectively. The doped semiconductor nanophosphors convert near UV light to the desired white light of the corresponding intensities.

In the example, assume that all of the LEDs in the array 111 are similar type devices, e.g. near UV LEDs each rated to produce 405 nm or the like in the near UV range. All will have the same current rating at which they are all expected to pump the semiconductor nanophosphor in the gas at 77 to cause the light engine 71 to output white light of a high CRI and particular color temperature. Since there is no pulse modulation change, there is no potential to change a state which might otherwise cause perceptible flickering.

As noted earlier, the circuit of FIG. 19 also offers sleeper LEDs 119. With the channels C1 to C3 all ON, the system would operate at its rated output level, but typically that is around 90% of the maximum output possible for the array 111, as the sleepers 119 will be OFF. If the intensity achieved by activation of the channels C1 to C3 drops, for example as indicated by level of intensity detected by sensor 145, the MCU 129 can turn ON the string of sleepers 119, to return to the desired performance level. Sleepers 119 then could be always ON whenever the system is ON, and the MCU 129 would control intensity by ON-OFF control of the LEDs on channels C1 to C3.

The dispersion of one nanophosphors in a gas may help to improve the efficiency of the phosphorescent emissions by each nanophosphor. The lighting industry has long used various gases in commercial lamp products and is quite familiar with techniques for manufacturing gas based products. So, manufacturing of fixtures that have a gas to bear the nanophosphors should be relatively easy to understand and implement in an efficient, practical manner. In the specific examples, the combination of a nanophosphor that has an emission spectrum that is separated from its absorption spectrum with a relatively transparent gas results in a nanophosphor suspension that exhibits little or no perceptible tint, when observed by a person while the light fixture is off. This can be a highly desirable feature for commercial light fixture products for general lighting applications and the like.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A light fixture, comprising:
  a solid state source for producing electromagnetic energy of a first emission spectrum; and
  a container, at least partially formed of an of optically transmissive material, coupled to receive electromagnetic energy from the solid state source;
  a gas filling an interior volume of the container;

a semiconductor nanophosphor dispersed in the gas in the container, wherein:
  (a) the semiconductor nanophosphor has an absorption spectrum encompassing at least a substantial portion of the first emission spectrum, and
  (b) when excited by electromagnetic energy in the absorption spectrum from the solid state source, the semiconductor nanophosphor emits visible light in a second emission spectrum that is separated from the absorption spectrum of the nanophosphor, for inclusion in a light output for the fixture.

2. The light fixture of claim 1, wherein the gas comprises one gas or a combination of gases each selected from the group consisting of: hydrogen gas, inert gases and hydrocarbon based gases.

3. The light fixture of claim 1, wherein the solid state source comprises a light emitting diode (LED) rated for producing electromagnetic energy of a wavelength in the range of 460 nm and below.

4. The light fixture of claim 1, wherein the semiconductor nanophosphor is a doped semiconductor nanophosphor.

5. The light fixture of claim 4, wherein the absorption spectrum of the doped semiconductor nanophosphor exhibits has an upper limit at approximately 460 nm or below.

6. The light fixture of claim 5, wherein the solid state source comprises a light emitting diode (LED) rated for producing electromagnetic energy of a wavelength in the range of 460 nm and below.

7. The light fixture of claim 6, wherein the LED is rated for producing electromagnetic energy of a wavelength in the range of 380-420 nm.

8. The light fixture of claim 1, further comprising a different semiconductor nanophosphor dispersed in the gas in the container, wherein:
  the different semiconductor nanophosphor has an absorption spectrum encompassing at least a substantial portion of the first emission spectrum, and
  when excited by electromagnetic energy in the absorption spectrum or the different semiconductor nanophosphor, from the solid state source, the different semiconductor nanophosphor emits visible light in a third emission spectrum that is separated from the absorption spectra of the nanophosphors and is different from the second emission spectrum, for inclusion in the visible light output from the fixture.

9. The light fixture of claim 8, wherein:
  the visible light output from the fixture produced by excitation of the semiconductor nanophosphors is at least substantially white;
  the visible light output from the fixture produced by the excitation of the semiconductor nanophosphors has a color rendering index (CRI) of 75 or higher; and
  the visible light output from the fixture produced by the excitation of the semiconductor nanophosphors has a color temperature in one of the following ranges:
    2,725±145° Kelvin;
    3,045±175° Kelvin;
    3,465±245° Kelvin; and
    3,985±275° Kelvin.

10. The light fixture of claim 9, wherein each of the semiconductor nanophosphors is a doped semiconductor nanophosphor.

11. The light fixture of claim 10, wherein at least one of the doped semiconductor nanophosphors comprises zinc selenide quantum dots doped with manganese or copper.

12. The light fixture of claim 10, wherein the gas with the doped semiconductor nanophosphors dispersed therein appears at least substantially clear when the solid state source is off.

13. The light fixture of claim 8, further comprising a reflector.

14. The light fixture of claim 13, wherein the reflector has a diffusely reflective surface forming an optical integrating cavity, receiving and diffusely reflecting the visible light emitted by the doped semiconductor phosphors to produce an integrated light output of the fixture of a fourth emission spectrum which includes visible light of the second emission spectrum and visible light of the third emission spectrum.

15. The light fixture of claim 14, wherein the container with the gas and nanophosphors fills at least a substantial portion of the volume of the optical integrating cavity.

16. The light fixture of claim 14, wherein:
  the fourth emission spectrum of the visible light output for the fixture is at least substantially white;
  the fourth emission spectrum of the visible light output for the fixture has a color rendering index (CRI) of 75 or higher; and
  the fourth emission spectrum of the visible light output for the fixture has a color temperature in one of the following ranges:
    2,725±145° Kelvin;
    3,045±175° Kelvin;
    3,465±245° Kelvin; and
    3,985±275° Kelvin.

17. The light fixture of claim 1, wherein the gas with the semiconductor nanophosphor dispersed therein appears at least substantially clear when the solid state source is off.

18. The light fixture of claim 1, further comprising a power supply for driving the solid state source to produce electromagnetic energy.

19. A light fixture for a general lighting application, comprising:
  a plurality of light emitting diodes (LEDs) for producing electromagnetic energy;
  a reflector having at least one diffusely reflective surface forming an optical integrating cavity coupled to receive electromagnetic energy from the LEDs;
  a container at least partially formed of an of optically transmissive material, coupled to the optical integrating cavity;
  a gas filling an interior volume of the container;
  a plurality of doped semiconductor nanophosphors dispersed in the gas in the container, wherein:
    (a) each of the doped semiconductor nanophosphors has an absorption spectrum encompassing at least a substantial portion of the first emission spectrum,
    (b) when excited by electromagnetic energy in its absorption spectrum from the LEDs, each of the doped semiconductor nanophosphors emits visible light in a different emission spectrum that is separated from the absorption spectra of the nanophosphors, into the optical integrating cavity, and
    (c) a light output of the fixture includes visible light of the emission spectra from excitation of the doped semiconductor nanophosphors integrated within the optical integrating cavity.

20. The light fixture of claim 19, wherein the container with the gas and nanophosphors fills at least a substantial portion of the volume of the optical integrating cavity.

21. The light fixture of claim 19, wherein:
(A) the integrated light is at least substantially white;
(B) the integrated light has a color rendering index (CRI) 75 or higher; and
(C) the integrated light has a color temperature in one of the following ranges:
2,725±145° Kelvin;
3,045±175° Kelvin;
3,465±245° Kelvin; and
3,985±275° Kelvin.

22. The light fixture of claim 21, wherein each of the LEDs is rated to produce a wavelength of near ultraviolet electromagnetic energy in a range of 380-420 nm.

23. The light fixture of claim 21, wherein the gas comprises one gas or a combination of gases each selected from the group consisting of: hydrogen gas, inert gases and hydrocarbon based gases.

24. The light fixture of claim 23, wherein the gas with the doped semiconductor nanophosphor dispersed therein appears at least substantially clear when the solid state source is off.

25. The light fixture of claim 23, wherein at least one of the one or more doped semiconductor nanophosphors comprises zinc selenide quantum dots doped with manganese or copper.

26. A light fixture for a lighting application, comprising:
a near ultraviolet (UV) solid state source, containing a semiconductor chip for producing near UV electromagnetic energy;
a macro optic outside and coupled to the near UV solid state source, for receiving and processing the near UV electromagnetic energy to produce a light output for the fixture; and
a container having an interior volume associated with the macro optic and apart from the semiconductor chip, positioned to receive near UV electromagnetic energy from the source;
a gas filling the interior volume of the container;
a plurality of doped semiconductor nanophosphors dispersed in the gas in the container, each of the doped semiconductor nanophosphors being of a type excited in response to near UV electromagnetic energy from the solid state source for re-emitting visible light of a different spectrum having substantially no overlap with absorption spectra of the doped semiconductor nanophosphors, the doped semiconductor nanophosphors together producing visible light in the output for the fixture from the fixture when excited, wherein:
(a) the visible light in the output for the fixture produced by near UV excitation of the doped semiconductor nanophosphors is at least substantially white;
(b) the visible light in the output for the fixture produced by near UV excitation of the doped semiconductor nanophosphors has a color rendering index (CRI) of 75 or higher; and
(c) the visible light in the output for the fixture produced by near UV excitation of the doped semiconductor nanophosphors has a color temperature of one of the following ranges:
2,725±145° Kelvin;
3,045±175° Kelvin;
3,465±245° Kelvin; and
3,985±275° Kelvin.

27. The light fixture of claim 26, wherein:
the near UV solid state source one or more light emitting diodes (LEDs), and
each LED is rated to produce a wavelength of near ultraviolet electromagnetic energy in a range of 380-420 mm.

28. The light fixture of claim 26, wherein the gas comprises one gas or a combination of gases each selected from the group consisting of: hydrogen gas, inert gases and hydrocarbon based gases.

29. The light fixture of claim 26, wherein the gas with the doped semiconductor nanophosphor dispersed therein appears at least substantially clear when the solid state source is off.

30. The light fixture of claim 26, wherein at least one of the one or more doped semiconductor nanophosphors comprises zinc selenide quantum dots doped with manganese or copper.

* * * * *